US007995635B2

(12) United States Patent
Fukuda

(10) Patent No.: US 7,995,635 B2
(45) Date of Patent: Aug. 9, 2011

(54) SEMICONDUCTOR LASER

(75) Inventor: Chie Fukuda, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/726,659

(22) Filed: Mar. 18, 2010

(65) Prior Publication Data

US 2010/0254422 A1 Oct. 7, 2010

(30) Foreign Application Priority Data

Apr. 3, 2009 (JP) ................................. 2009-091403

(51) Int. Cl.
*H01S 3/10* (2006.01)
*H01S 5/00* (2006.01)
*H01S 3/08* (2006.01)

(52) U.S. Cl. .................... 372/50.11; 372/20; 372/46.01; 372/96

(58) Field of Classification Search .................. None
See application file for complete search history.

(56) References Cited

U.S. PATENT DOCUMENTS

| 4,885,753 | A | * | 12/1989 | Okai et al. | 372/50.1 |
| 5,084,894 | A | * | 1/1992 | Yamamoto | 372/96 |
| 5,333,141 | A | * | 7/1994 | Wolf et al. | 372/50.1 |
| 6,104,739 | A | * | 8/2000 | Hong et al. | 372/50.11 |
| 7,145,923 | B2 | * | 12/2006 | Carter et al. | 372/20 |
| 2006/0209911 | A1 | * | 9/2006 | Takabayashi | 372/50.11 |
| 2008/0240180 | A1 | * | 10/2008 | Matsui et al. | 372/26 |

FOREIGN PATENT DOCUMENTS

WO 03/012936 2/2003

OTHER PUBLICATIONS

Yukiya A. Akulova et al., "Widely Tunable Electroabsorption-Modulated Sampled-Grating DBR Laser Transmitter", IEEE Journal of Selected Topics in Quantum Electronics, vol. 8, No. 6, pp. 1349-1357 (2002).
Yuliya A. Akulova et al., "Widely Tunable Electroabsorption-Modulated Sampled-Grating DBR Laser Transmitter", IEEE Journal of Selected Topics in Quantum Electronics, vol. 8, No. 6, pp. 1349-1357 (2002).

* cited by examiner

*Primary Examiner* — Jessica T Stultz
*Assistant Examiner* — Sean Hagan
(74) *Attorney, Agent, or Firm* — Smith, Gambrell & Russell, LLP

(57) ABSTRACT

A wavelength tunable laser according to the present invention includes a first facet and a second facet opposite the first facet, a reflective region provided adjacent to the second facet, and a gain region provided between the first facet and the reflective region. The reflective region has a plurality of reflection peak wavelengths that periodically vary at a predetermined wavelength interval. The first facet and the reflective region constitute a laser cavity. Furthermore, the gain region includes an active layer where light is generated, a diffraction grating layer having a diffraction grating whose grating pitch varies in a light propagation direction, a refractive-index control layer provided between the active layer and the diffraction grating layer, a first electrode for injecting current into the active layer, and a plurality of second electrodes arranged in the light propagation direction to inject current into the refractive-index control layer.

17 Claims, 17 Drawing Sheets

Position in the light propagation direction [μ m]

SEMICONDUCTOR LASER

BACKGROUND OF THE INVENTION

1. Field of the Invention

The present invention relates to semiconductor lasers.

2. Description of the Related Art

International Publication No. WO2003-012936 (referred to as "Patent Document 1" hereinafter) and Yuliya A. Akulova et al., "Widely Tunable Electroabsorption Modulated Sampled-Grating DBR Laser Transmitter", IEEE Journal of Selected Topics in Quantum Electronics, Vol. 8, No. 6, pp. 1349-1357 (2002) (referred to as "Non-Patent Document 1" hereinafter) each disclose a wavelength tunable semiconductor laser with distributed Bragg reflectors (DBR) disposed on opposite sides of a gain region.

The semiconductor laser discussed in Patent Document 1 includes two distributed Bragg reflectors, one of which having a chirped diffraction grating whose grating pitch varies in a light propagation direction and a plurality of electrodes arranged in the light propagation direction. In this semiconductor laser, light having a desired wavelength is reflected by applying current selectively to the plurality of electrodes formed in the one distributed Bragg reflector. The other distributed Bragg reflector has another diffraction grating having a plurality of reflection peaks in a reflection spectrum. When wavelengths at reflection peaks of the two distributed Bragg reflectors overlap each other, laser oscillation occurs at the aforementioned wavelength. The oscillation wavelength can be changed by adjusting the current applied to the corresponding electrode formed in the one distributed Bragg reflector.

In the semiconductor laser discussed in Non-Patent Document 1, two distributed Bragg reflectors have a sampled-grating (SG) structure. In this semiconductor laser, the oscillation wavelength can be changed by controlling the current individually applied to the two distributed Bragg reflectors.

SUMMARY OF THE INVENTION

A semiconductor laser according to the present invention is a wavelength tunable semiconductor laser that includes a first facet and a second facet opposite the first facet, a reflective region provided adjacent to the second facet, and a gain region provided between the first facet and the reflective region. The reflective region has a plurality of reflection peak wavelengths at which reflection peaks occur in a reflection spectrum of the reflective region. The reflection peak wavelengths periodically vary at a predetermined wavelength interval. The first facet and the reflective region constitute a laser cavity. The gain region includes an active layer where light is generated, a diffraction grating layer having a diffraction grating whose grating pitch varies in a light propagation direction, a refractive-index control layer provided between the active layer and the diffraction grating layer, a first electrode for injecting current into the active layer, and a plurality of second electrodes arranged in the light propagation direction to inject current into the refractive-index control layer.

In this semiconductor laser, the first facet of the semiconductor laser and the reflective region provided adjacent to the second facet opposite the first facet constitute the laser cavity. The gain region includes the diffraction grating layer having the diffraction grating. This gain region is disposed within the laser cavity. The diffraction grating in this gain region increases an optical loss of light propagating through the gain region. The grating pitch of this diffraction grating varies in the light propagation direction, and a reflection spectrum of the diffraction grating has a predetermined reflectivity over a wide wavelength range from a wavelength corresponding to the shortest grating pitch to a wavelength corresponding to the longest grating pitch. The light propagating in the laser cavity interacts with this diffraction grating. Then, the diffraction grating increases the optical loss for the light propagating in the gain region.

The refractive-index control layer is provided between the diffraction grating layer and the active layer, and the second electrodes are arranged in the light propagation direction to inject current into the refractive-index control layer. In such a configuration, when current is injected into the refractive-index control layer from any one of the second electrodes, the refractive index of only a part of the refractive-index control layer that is located directly below the aforementioned second electrode changes. When the current is injected into the aforementioned part of the refractive-index control layer, the reflectivity of the diffraction grating formed in the gain region decreases in the wavelength range reflected by the aforementioned part. Then optical loss in the laser cavity also decreases in this wavelength range by injecting current into the aforementioned part of the refractive-index control layer through the aforementioned second electrode.

On the other hand, the reflective region has a plurality of reflection peak wavelengths that periodically vary at a predetermined wavelength interval. When the wavelength range where the optical loss is reduced by injecting current overlaps the reflection peak wavelength of the reflective region, laser oscillation occurs at this wavelength. Therefore, a lasing wavelength of the semiconductor laser can be controlled by changing this wavelength range and the reflection peak wavelength.

Furthermore, in the semiconductor laser, the diffraction grating included in the diffraction grating layer of the gain region may be a chirped diffraction grating whose grating pitch varies continuously. Alternatively, in the semiconductor laser, the diffraction grating included in the diffraction grating layer of the gain region may be a diffraction grating whose grating pitch varies intermittently. With either one of these configurations, the diffraction grating according to the present invention can be favorably achieved.

Furthermore, in the semiconductor laser, the diffraction grating of the diffraction grating layer of the gain region has a reflectivity that is smaller than a reflectivity of the first facet. Preferably, the diffraction grating of the diffraction grating layer of the gain region has a reflectivity that ranges between 2% and 10%.

Furthermore, in the semiconductor laser, the diffraction grating of the diffraction grating layer has a wavelength range in which a reflectivity of the diffraction grating changes by injecting current into one of the plurality of second electrodes. Preferably, the wavelength range is equal to the predetermined wavelength interval between the reflection peak wavelengths of the reflective region. In consequence, the wavelength ranges and the reflection peaks have a one-to-one relationship. Therefore, the wavelength ranges and the reflection peaks can favorably be made to overlap each other.

Furthermore, in the semiconductor laser, the gain region may further include a stripe-shaped mesa structure including the active layer, a first semi-insulating region that covers both side surfaces of the stripe-shaped mesa structure including the active layer, and a first semi-insulating layer formed between the active layer and the refractive-index control layer. With the first semi-insulating region that covers the both side surfaces of the stripe-shaped mesa structure including the active layer, current can be efficiently injected into the active layer. Moreover, by providing the first semi-insulating layer between the active layer and the refractive-index control layer, current can be individually injected into the active layer and the refractive-index control layer.

Furthermore, in the semiconductor laser, a reflectivity of the reflective region may range between 50% and 90%.

Furthermore, in the semiconductor laser, the refractive-index control layer and the diffraction grating layer may each have a bandgap wavelength that is shorter than a bandgap wavelength of the active layer. This allows for efficient confinement of light with respect to the active layer.

Furthermore, in the semiconductor laser, the reflective region may include an optical waveguide optically coupled to the first facet and a super-structure grating provided along the optical waveguide. Furthermore, the optical waveguide includes an optical waveguide layer as a core portion thereof. In consequence, a reflective region having a plurality of reflection peak wavelengths that periodically vary at a predetermined wavelength interval can be favorably achieved.

In this case, the reflective region may include a stripe-shaped mesa structure including the optical waveguide and have a configuration in which both side surfaces of the stripe-shaped mesa structure including the optical waveguide are covered with a second semi-insulating region. Moreover, the reflective region may include a refractive-index control layer of the reflective region formed on the optical waveguide, a reflective diffraction grating layer including the super-structure grating and provided on the refractive-index control layer of the reflective region, and a second semi-insulating layer formed between the optical waveguide and the refractive-index control layer of the reflective region. In consequence, a reflective region having the aforementioned super-structure grating can be favorably achieved.

Furthermore, in this case, the refractive-index control layer of the reflective region and the reflective diffraction grating layer may each have a bandgap wavelength that is shorter than a bandgap wavelength of the optical waveguide layer of the reflective region. This allows for efficient confinement of light with respect to the optical waveguide layer.

Furthermore, the reflective region may include a ring resonator whose one end is optically connected to the gain region, and a dielectric multilayer provided at another end of the ring resonator. In consequence, a reflective region having a plurality of reflection peak wavelengths that periodically vary at a predetermined wavelength interval can be favorably achieved.

Furthermore, the ring resonator may include a light modulating layer that constitutes a core portion of an optical waveguide, a cladding layer provided on the light modulating layer, a contact layer provided on the cladding layer, and an electrode provided on the contact layer.

Furthermore, the semiconductor laser may further include a phase adjusting region provided between the gain region and the reflective region to control an optical path length of a waveguide between the gain region and the reflective region. With such a phase adjusting region provided between the gain region and the reflective region, a laser oscillation wavelength can be changed continuously.

In this case, the phase adjusting region may include a phase-adjustment optical waveguide, a stripe-shaped mesa structure including the phase-adjustment optical waveguide, a third semi-insulating region that covers both side surfaces of the stripe-shaped mesa structure including the phase-adjustment optical waveguide, a refractive-index control layer of the phase adjusting region formed on the phase-adjustment optical waveguide, and a third semi-insulating layer formed between the phase-adjustment optical waveguide and the refractive-index control layer. The optical path length of the waveguide between the gain region and the reflective region changes by injecting current into the refractive-index control layer of the phase adjusting region The aforementioned object and other objects, features, and advantages of the present invention will become more apparent from the following detailed description of preferred embodiments of the present invention with reference to the attached drawings.

DESCRIPTION OF THE PREFERRED EMBODIMENTS

Figure 1:
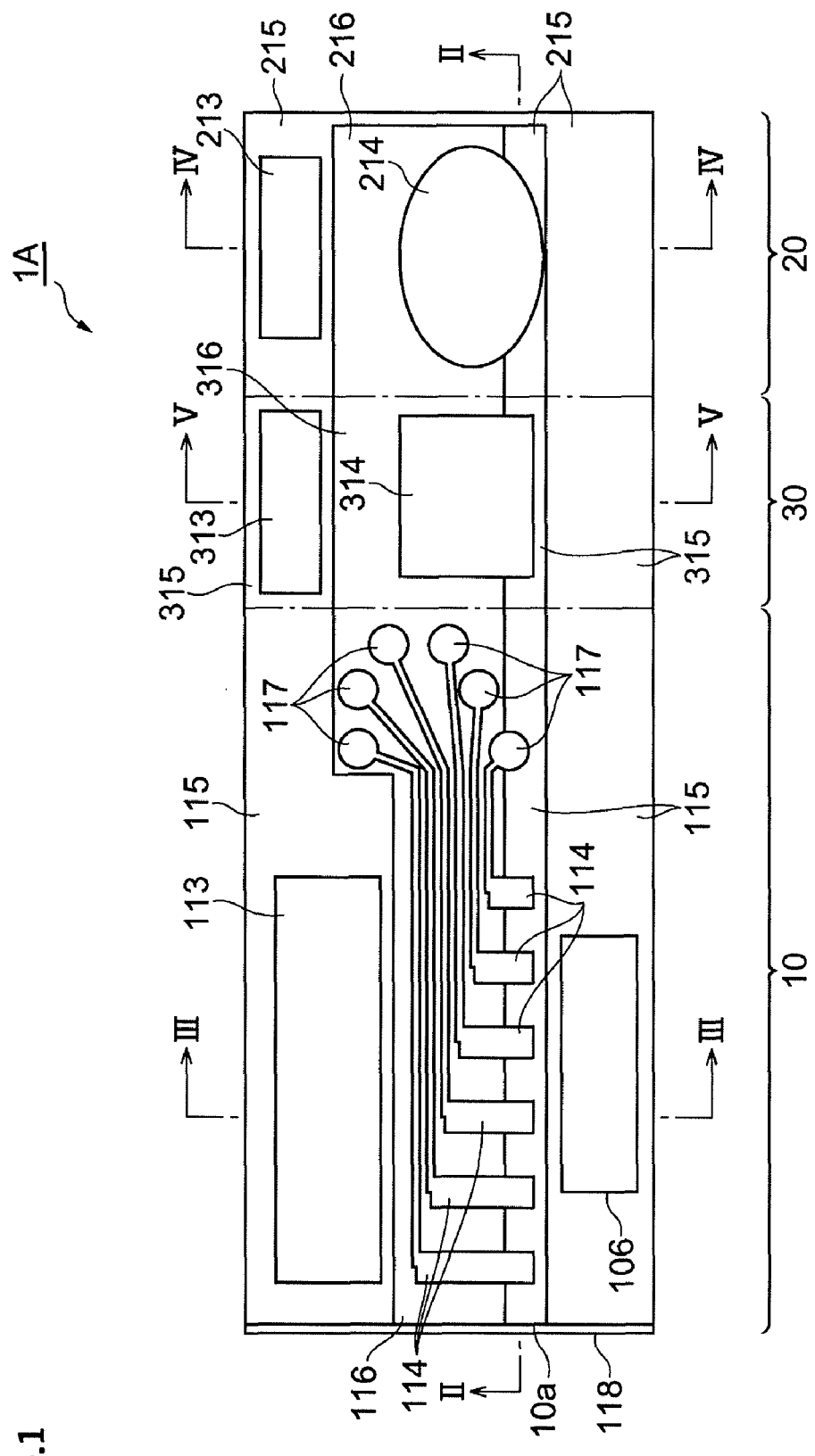
FIG. 1 is a plan view showing the configuration of a semiconductor laser according to a first embodiment of the present invention.

Embodiments of the present invention will be described in detail below with reference to the attached drawings. In the drawings, the same components are given the same reference numerals, and redundant descriptions will be omitted.

First Embodiment

Figure 2:
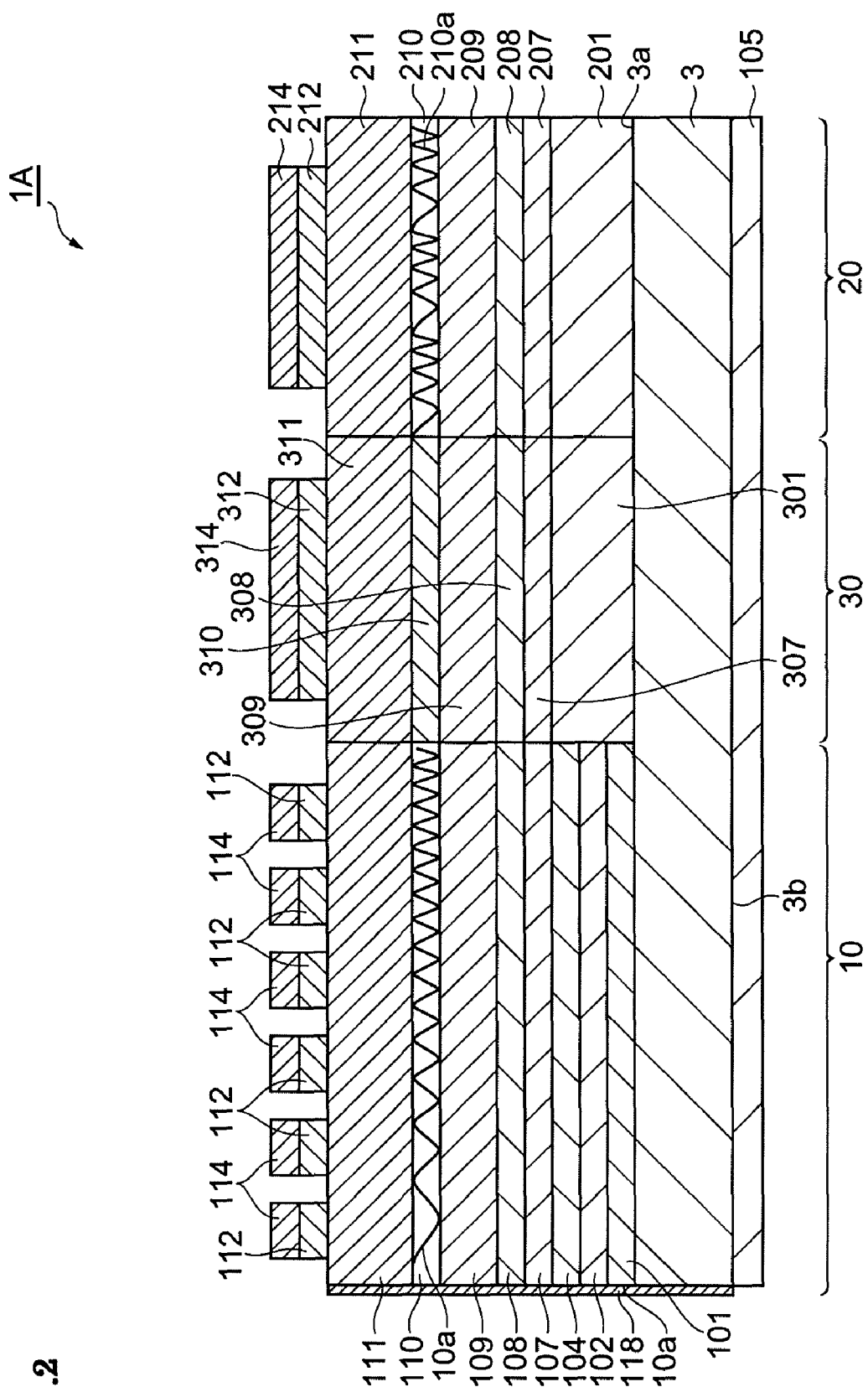
FIG. 2 is a sectional view of the semiconductor laser taken along line II-II in FIG. 1.

A semiconductor laser 1A according to a first embodiment is a tunable semiconductor laser that can change the laser oscillation wavelength. Referring to FIGS. 1 and 2, the semiconductor laser 1A according to this embodiment includes a gain region 10, a reflective region 20, and a phase adjusting region 30. The gain region 10 is a region where light is generated by injecting current into the active layer of the gain region. The reflective region 20 is a region that reflects light propagating from the gain region 10. The phase adjusting region 30 is a region for controlling the optical path length between the gain region 10 and the reflective region 20. As shown in FIG. 2, the gain region 10, the reflective region 20, and the phase adjusting region 30 are formed on a common semiconductor substrate 3, and the gain region 10, the reflective region 20, and the phase adjusting region 30 are arranged in that order in a light propagating direction. The semiconductor substrate 3 is composed of a first-conductivity-type semiconductor, such as n-type InP.

Figure 3:
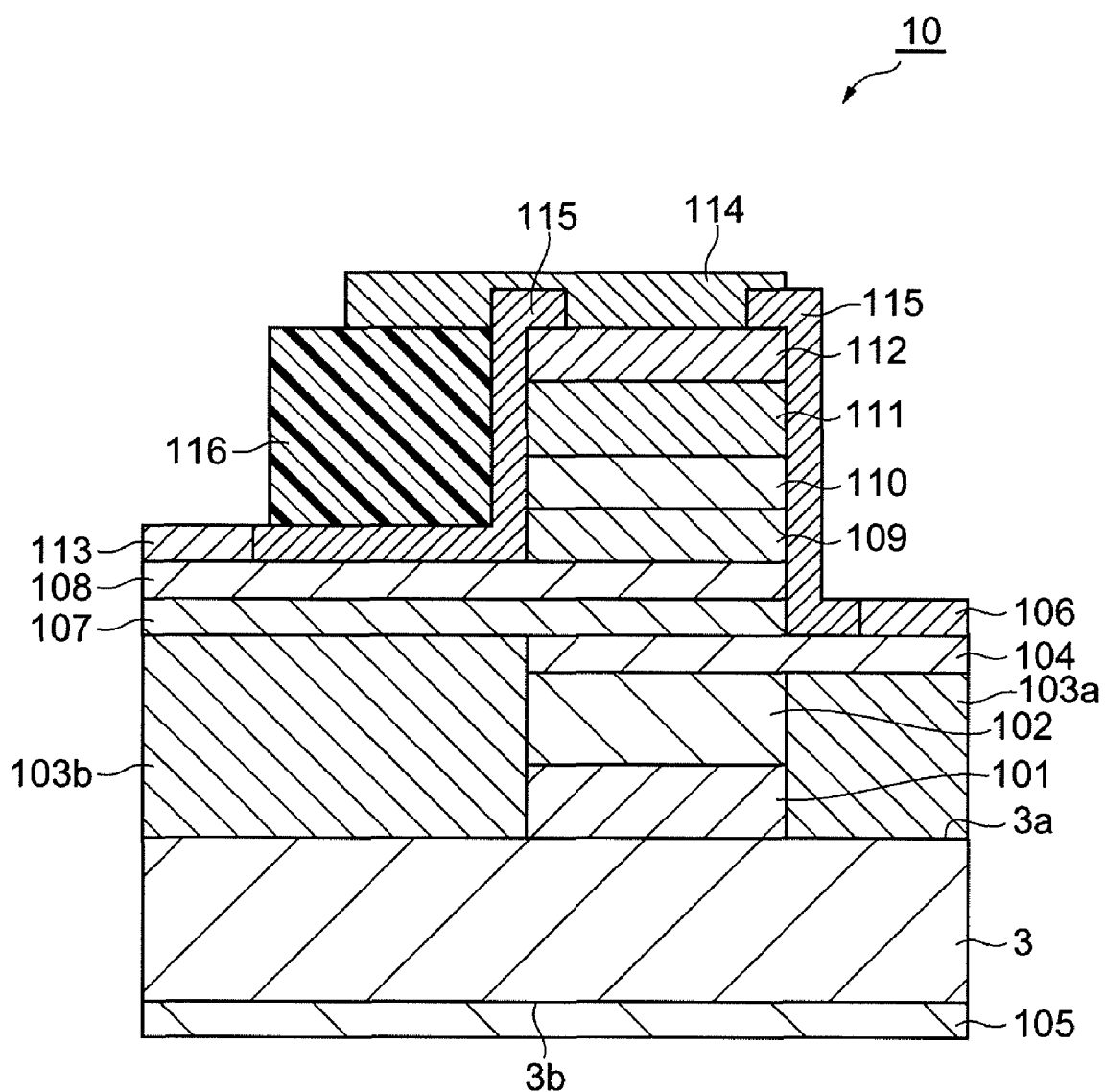
FIG. 3 is a sectional view of the semiconductor laser taken along line in FIG. 1.

First, the configuration of the gain region 10 will be described with reference to FIGS. 1 to 3. As shown in FIGS. 1 to 3, the gain region 10 includes an active layer 101, a separate confinement heterostructure (SCH) layer 102, semi-insulating regions 103a and 103b, a contact layer 104, a cathode electrode 105, and an anode electrode 106. The gain region 10 also includes a first semi-insulating layer 107, a first-conductivity-type semiconductor layer 108, a refractive-index control layer 109, a diffraction grating layer 110, a cladding layer 111, a contact layer 112, a cathode electrode 113, and a plurality of anode electrodes 114.

The active layer 101 has, for example, a multi-quantum well structure including a plurality of well layers and a plurality of barrier layers that are alternately stacked one on top of the other. The well layers and the barrier layers are composed of InGaAsP with different compositions, and the overall thickness of the multi-quantum well structure is, for example, 115 nm. The wavelength of light emitted from the active layer 101 is, for example, 1.55 µm.

The SCH layer 102 is provided on the active layer 101 and is composed of a second-conductivity-type semiconductor, such as p-type InGaAsP. The bandgap wavelength of the SCH layer 102 is shorter than the bandgap wavelength of the active layer 101 and is, for example, 1.2 µm or smaller. The SCH layer 102 has a thickness of, for example, 85 nm.

The semiconductor laser 1A has a stripe-shaped mesa structure including the active layer 101 and the SCH layer 102. The width of each of the active layer 101 and the SCH layer 102 in a direction orthogonal to the light propagation direction is, for example, 1.8 µm. The length of each of the active layer 101 and the SCH layer 102 in the light propagation direction is, for example, 570 µm.

The semi-insulating regions 103a and 103b is a first semi-insulating regions in this embodiment. The semi-insulating regions 103a and 103b are each composed of a semi-insulating semiconductor, such as Fe-doped InP. The semi-insulating regions 103a and 103b respectively cover opposite sides of the stripe-shaped mesa structure including the active layer 101 and the SCH layer 102.

The contact layer 104 is provided on the SCH layer 102 and the semi-insulating region 103a. The contact layer 104 is composed of a second-conductivity-type semiconductor, such as p-type InGaAs. The contact layer 104 has a thickness of, for example, 50 nm.

In this embodiment, the anode electrode 106 is a first electrode for injecting current into the active layer 101. The anode electrode 106 is provided on a part of the contact layer 104 that is located on the semi-insulating region 103a. The anode electrode 106 is an ohmic electrode composed of, for example, AuZn. On the other hand, the cathode electrode 105 is provided on a back surface 3b of the semiconductor substrate 3. By connecting an external power source to the anode electrode 106 and the cathode electrode 105, current can be injected into the active layer 101. The cathode electrode 105 is an ohmic electrode composed of, for example, AuGe. The cathode electrode 105 and the anode electrode 106 each have a thickness of, for example, 0.5 µm.

The first semi-insulating layer 107 is composed of a semi-insulating semiconductor, such as Fe-doped InP. The first semi-insulating layer 107 is provided on a part of the contact layer 104 and on the semi-insulating region 103b. The first semi-insulating layer 107 electrically separates the first-conductivity-type semiconductor layer 108 from the contact layer 104. The first semi-insulating layer 107 has a thickness of, for example, 50 nm.

The first-conductivity-type semiconductor layer 108 is composed of, for example, n-type InP and is provided on the first semi-insulating layer 107. The first-conductivity-type semiconductor layer 108 has a thickness of, for example, 50 nm.

The refractive-index control layer 109 is provided between the active layer 101 and the diffraction grating layer 110, more specifically, between a part of the first-conductivity-type semiconductor layer 108 located above the mesa structure and the diffraction grating layer 110. The refractive-index control layer 109 is composed of, for example, undoped InGaAsP. The refractive-index control layer 109 has a thickness of, for example, 250 nm.

The diffraction grating layer 110 is a layer provided along the active layer 101 extending in a predetermined light propagation direction. In this embodiment, the diffraction grating layer 110 is provided on the refractive-index control layer 109. The diffraction grating layer 110 has a thickness of, for example, 50 nm. The diffraction grating layer 110 is constituted of, for example, two layers of a p-type InGaAsP layer and a p-type InP layer formed thereon. This p-type InGaAsP layer is made of InGaAsP semiconductor having a different composition from that of the refractive-index control layer 109. The diffraction grating layer 110 includes a diffraction grating 110a (see FIG. 2) formed on the p-type InGaAsP layer and whose grating pitch varies in the light propagation direction. With respect to light in a wide wavelength range, the diffraction grating 110a has a lower reflectivity than that of a facet 10a of the gain region. In this embodiment, the end facet 10a of the gain region 10 corresponds to the first facet of the semiconductor laser 1A. For example, the diffraction grating 110a has a low reflectivity ranging between 2% and 10%. On the other hand, the semiconductor laser 1A has the reflective region 20 with high reflectivity of more than 50% opposite the facet 10a. Therefore, in the semiconductor laser 1A, a diffraction grating formed in the reflective region 20 and the facet 10a of the gain region 10 constitute a laser cavity. In other words, the diffraction grating 110a does not work as a reflective mirror in the laser cavity. By disposing the diffraction grating 110a having a low reflectivity within the laser cavity, the laser cavity has an optical loss (internal loss) for light generated in the active layer 101 and propagating through the gain region 10 in the wide wavelength range. As mentioned above, the diffraction grating 110a has a reflectivity in the range between, for example, 2% and 10% when current is not injected into the refractive-index control layer 109. Moreover, a coupling coefficient κ between the diffraction grating 110a and the active layer 101 is 80 cm$^{-1}$ or smaller. By setting the coupling coefficient κ between the diffraction grating 110a and the active layer 101 to a small value, an advantage relatively similar to that achieved by reducing the reflectivity of the diffraction grating 110a reflecting the light generated in the active layer 101 can be expected. If the reflectivity of the diffraction grating 110a is greater than the reflectivity of the facet 10a, the optical loss in the cavity increases. Then, it is difficult to obtain laser oscillation in the laser cavity composed of the diffraction grating formed in the reflective region 20 and the facet 10a.

The grating pitch of the diffraction grating 110a is not constant but varies in the light propagation direction. For example, the diffraction grating 110a is formed of a chirped diffraction grating whose grating pitch varies continuously in the light propagation direction. Alternatively, the diffraction grating 110a may have a configuration such that the grating pitch thereof varies intermittently. In detail, supposing that the diffraction grating 110a is divided into a plurality of segments $A_1$ to $A_n$, in the light propagation direction, grating pitches $a_1$ to $a_n$ of the respective segments $A_1$ to $A_n$ each are constant in the corresponding segment and satisfy the relationship $a_1<a_2<\ldots<a_n$ (or $a_1>a_2>\ldots>a_n$) (referred to as "stepped diffraction grating" hereinafter).

In this manner, the grating pitch of the diffraction grating 110a varies in the light propagation direction. Therefore, light propagating through the diffraction grating 110a has optical loss in a wide wavelength range that covers from a wavelength corresponding to the shortest grating pitch to a wavelength corresponding to the longest grating pitch.

In order to effectively confine light to the active layer 101, the refractive-index control layer 109 is composed of a material with a reflectivity lower than that of the active layer 101. For example, the refractive-index control layer 109 is made of GaInAsP having the bandgap wavelength of 1.3 μm or smaller. Furthermore, the bandgap wavelength of the p-type InGaAsP layer of the diffraction grating layer 110 is preferably shorter than the bandgap wavelength of the active layer 101 and the refractive-index control layer 109. For example, the p-type InGaAsP layer of the diffraction grating layer 110 is made of InGaAsP having the bandgap wavelength of 1.2 μm or smaller.

The cladding layer 111 is composed of a second-conductivity-type semiconductor, such as p-type InP, and is provided on the diffraction grating layer 110. The cladding layer 111 has a bandgap wavelength that is shorter than the bandgap wavelength of the refractive-index control layer 109 and the p-type InGaAsP layer of the diffraction grating layer 110, and has a thickness of, for example, 1 μm.

As shown in FIG. 2, the contact layer 112 is divided into multiple parts at a predetermined interval in the light propagation direction on the cladding layer 111. This interval is set equal to the interval of the plurality of anode electrodes 114, to be described later. The contact layer 112 is composed of a second-conductivity-type semiconductor, such as p-type InGaAs, and has a thickness of, for example, 0.2 μm.

The semiconductor laser 1A has a stripe-shaped mesa structure including the refractive-index control layer 109, the diffraction grating layer 110, the cladding layer 111, and the contact layer 112 described above. The upper surface and both side surfaces of this stripe-shaped mesa structure are covered with an insulating film 115 composed of, for example, $SiO_2$. The insulating film 115 is also provided on the first-conductivity-type semiconductor layer 108 and on the contact layer 104. A part of the insulating film 115 that is disposed on the contact layer 104 is provided with an opening for the anode electrode 106. The insulating film 115 has a thickness of, for example, 0.3 μm.

A part of the insulating film 115 that is disposed on the first-conductivity-type semiconductor layer 108 is provided with an opening for the cathode electrode 113. Moreover, a part of the insulating film 115 that is disposed on the contact layer 112 is provided with a plurality of openings for forming the plurality of anode electrodes 114. The anode electrodes 114 are second electrodes in this embodiment and are provided on the contact layer 112. The anode electrodes 114 are arranged at a predetermined interval in the light propagation direction. The anode electrodes 114 are, for example, ohmic electrodes composed of AuZn. The cathode electrode 113 is provided on the first-conductivity-type semiconductor layer 108. By connecting an external power source between the cathode electrode 113 and the anode electrodes 114, current can be injected into the refractive-index control layer 109. The cathode electrode 113 is an ohmic electrode composed of, for example, AuGe. The cathode electrode 113 and the anode electrodes 114 each have a thickness of, for example, 0.5 μm.

On the insulating film 115, a resin layer 116 is provided along one side surface of the stripe-shaped mesa structure. The anode electrodes 114 extend to the top of the resin layer 116 and are connected to corresponding electrode pads 117 via an electrically connecting pattern on the resin layer 116, as shown in FIG. 1. The resin layer 116 is composed of, for example, bisbenzocyclobutene (BCB) resin and has a thickness of, for example, 1 μm to 2 μm.

Although a common cathode electrode 113 is provided for the plurality of anode electrodes 114 in this embodiment, a plurality of cathode electrodes corresponding to the plurality of anode electrodes 114 may alternatively be provided.

As shown in FIGS. 1 and 2, one facet of the semiconductor laser 1A, that is, the facet 10a of the gain region 10, is provided with a dielectric multilayer 118. The facet 10a is one of light reflecting mirrors of the laser cavity in the semiconductor laser 1A. The reflectivity of the dielectric multilayer 118 is, for example, 30%. The facet 10a may have a different reflection structure so high as such a reflectivity can be achieved; for example, the facet 10a may be a cleaved facet.

Figure 4:
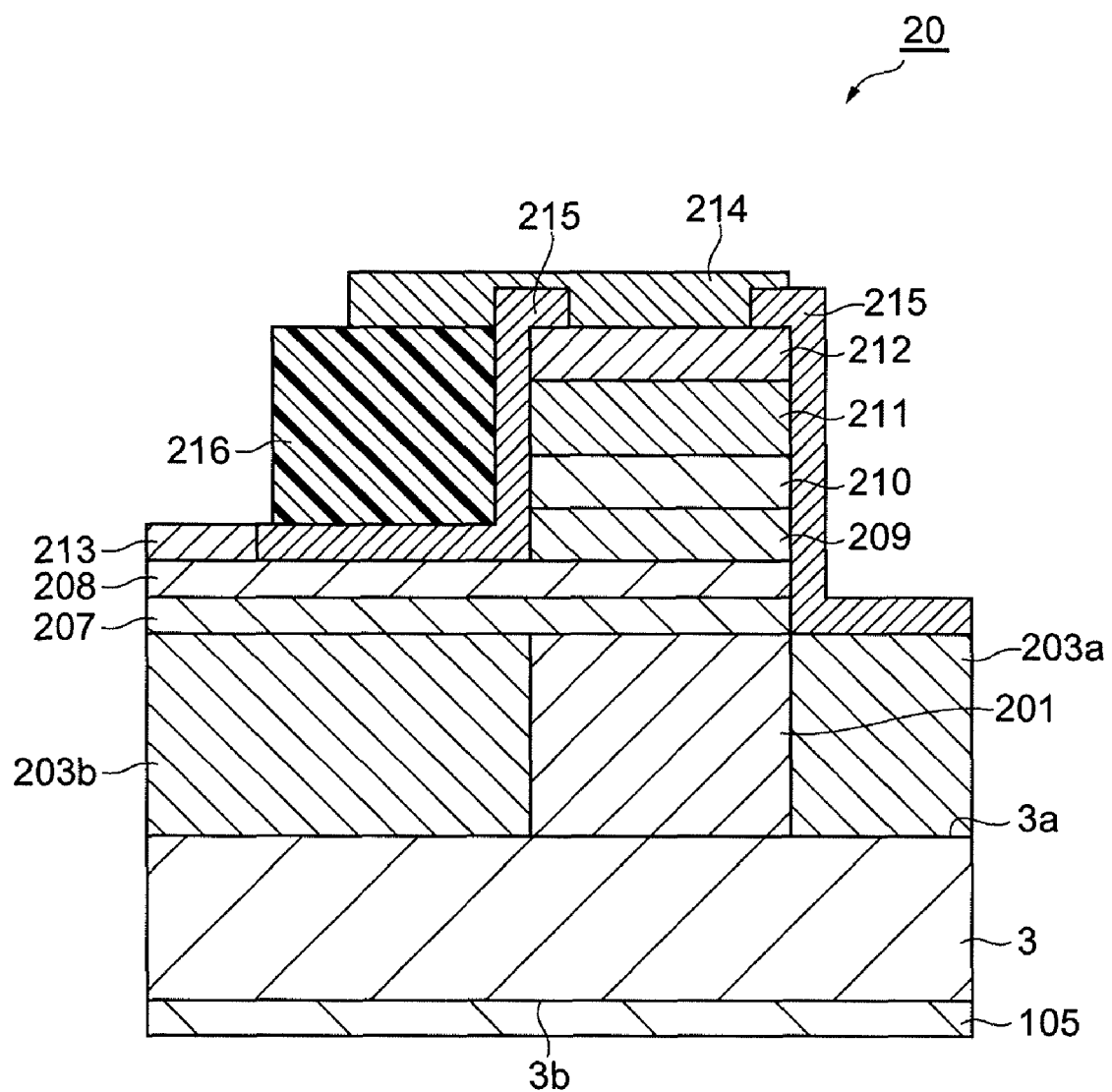
FIG. 4 is a sectional view of the semiconductor laser taken along line IV-IV in FIG. 1.

Next, the configuration of the reflective region 20 will be described with reference to FIGS. 1, 2, and 4. This reflective region 20 has a function of another reflective mirror in the laser cavity. In this embodiment, an end facet of the reflective region 20 corresponds to the second facet of the semiconductor laser 1A. As shown in these drawings, the reflective region 20 includes an optical waveguide layer 201 and semi-insulating regions 203a and 203b. The reflective region 20 also includes a second semi-insulating layer 207, a first-conductivity-type semiconductor layer 208, a refractive-index control layer 209, a diffraction grating layer 210, a cladding layer 211, a contact layer 212, a cathode electrode 213, and an anode electrode 214.

The optical waveguide layer 201 is a core portion of an optical waveguide in the reflective region 20 and is optically coupled to the active layer 101 and the SCH layer 102 at a facet opposite the facet 10a of the gain region 10 via the phase adjusting region 30, to be described later. The optical waveguide layer 201 in this embodiment is provided on a principal surface 3a of the semiconductor substrate 3 and is composed of, for example, undoped InGaAsP. The bandgap wavelength of the optical waveguide layer 201 is shorter than the bandgap wavelength of the active layer 101 in the gain region 10 and is, for example, 1.3 μm or smaller. The optical waveguide layer 201 has a thickness of, for example, 250 μm. The optical waveguide layer 201 forms a stripe-shaped mesa structure on the principal surface 3a of the semiconductor substrate 3. The width of the optical waveguide layer 201 in the direction orthogonal to the light propagation direction is, for example, 1.8 µm.

The semi-insulating regions 203a and 203b is second semi-insulating regions in this embodiment. The semi-insulating regions 203a and 203b are each composed of a semi-insulating semiconductor, such as Fe-doped InP. The semi-insulating regions 203a and 203b are formed so as to cover opposite side surfaces of the stripe-shaped mesa structure including the optical waveguide layer 201 in the reflective region 20.

The second semi-insulating layer 207 is composed of a semi-insulating semiconductor, such as Fe-doped InP. The second semi-insulating layer 207 is provided on the optical waveguide layer 201 and the semi-insulating region 203b. The second semi-insulating layer 207 electrically separates the first-conductivity-type semiconductor layer 208 from the optical waveguide layer 201. The second semi-insulating layer 207 has a thickness of, for example, 50 nm.

The first-conductivity-type semiconductor layer 208 is composed of, for example, n-type InP and is provided on the second semi-insulating layer 207. The first-conductivity-type semiconductor layer 208 has a thickness of, for example, 50 nm.

The refractive-index control layer 209 is used for controlling its refractive index which is changed by injecting current into this layer through the cathode electrode 213 and the anode electrode 214. This refractive-index control layer 209 is provided between the optical waveguide layer 201 and the diffraction grating layer 210, more specifically, between a part of the first-conductivity-type semiconductor layer 208 that is located above the optical waveguide layer 201 and the diffraction grating layer 210. The refractive-index control layer 209 is composed of, for example, undoped InGaAsP. The refractive-index control layer 209 has a thickness of, for example, 250 nm.

Similar to the optical waveguide layer 201, the diffraction grating layer 210 is provided so as to extend in the predetermined light propagation direction. In this embodiment, the diffraction grating layer 210 is provided on the refractive-index control layer 209. The diffraction grating layer 210 has a thickness of, for example, 50 nm. The diffraction grating layer 210 is composed of, for example, two layers of a p-type InGaAsP layer and a p-type InP layer provided thereon. The p-type InGaAsP layer is a reflective diffraction grating layer and has a diffraction grating formed on a surface thereof. The reflective diffraction grating layer made of p-type InGaAsP layer in the diffraction grating layer 210 is made of an InGaAsP semiconductor having a composition different from that of the refractive-index control layer 209. The pitch of this diffraction grating is adjusted so that the diffraction grating forms a super-structure grating (SSG) (see FIG. 2). The reflection spectrum of the diffraction grating layer 210 has a plurality of reflection peaks. The wavelength at which the reflection peak occurs in the reflection spectrum is referred to as "reflection peak wavelength" hereinafter. The reflection peak wavelengths periodically vary at a predetermined wavelength interval. The reflection peak wavelengths of the diffraction grating layer 210 shift in accordance with a change in the reflectivity of the refractive-index control layer 209. Specifically, by adjusting the magnitude of current injecting into the refractive-index control layer 209 through the cathode electrode 213 and the anode electrode 214, the reflection peak wavelengths of the diffraction grating layer 210 can be controlled.

Of the light propagating from the gain region 10, only the light having a wavelength component corresponding to a reflection peak wavelength is reflected towards the gain region 10 by the SSG formed in the reflective region 20. Specifically, the SSG formed in the reflective region 20 functions as a mirror of the laser cavity. The reflectivity of the SSG in the reflective region 20 is preferably in the range from 50% to 90%.

In order to effectively confine light to the optical waveguide layer 201, the bandgap wavelength of the refractive-index control layer 209 is preferably smaller than, for example, 1.3 µm and shorter than the bandgap wavelength of the optical waveguide layer 201. Moreover, the bandgap wavelength of the reflective diffraction grating layer made of p-type InGaAsP of the diffraction grating layer 210 is preferably shorter than the bandgap wavelength of the optical waveguide layer 201 and is, for example, 1.2 µm or smaller.

In place of an SSG structure 210a, the diffraction grating layer 210 may alternatively have a sampled grating (SG) structure. In the SG structure, regions in which the amplitude of refractive-index modulation is relatively large and regions in which the amplitude of refractive-index modulation is relatively small are alternately arranged with a constant period in the light propagation direction.

The cladding layer 211 is composed of a second-conductivity-type semiconductor, such as p-type InP, and is provided on the diffraction grating layer 210. The cladding layer 211 has a bandgap wavelength that is shorter than the bandgap wavelength of the refractive-index control layer 209 and the reflective diffraction grating layer in the diffraction grating layer 210, and has a thickness of, for example, 1 µm.

The contact layer 212 is provided on the cladding layer 211. The contact layer 212 is composed of a second-conductivity-type semiconductor, such as p-type InGaAs, and has a thickness of, for example, 0.2 µm.

Similar to the refractive-index control layer 109, the diffraction grating layer 110, the cladding layer 111, and the contact layer 112 in the gain region 10, the refractive-index control layer 209, the diffraction grating layer 210, the cladding layer 211, and the contact layer 212 constitute a stripe-shaped mesa structure extending in the predetermined light propagation direction. An insulating film 215 composed of, for example, SiO$_2$ is formed on the upper surface and both side surfaces of the stripe-shaped mesa structure. The insulating film 215 has a thickness of, for example, 0.3 µm.

A part of the insulating film 215 that is provided on the first-conductivity-type semiconductor layer 208 is provided with an opening for the cathode electrode 213, and a part of the insulating film 215 that is provided on the contact layer 212 is provided with an opening for the anode electrode 214. The anode electrode 214 is provided on the contact layer 212 and is an ohmic electrode composed of, for example, AuZn. The cathode electrode 213 is provided on a part of the first-conductivity-type semiconductor layer 208 that is located above the semi-insulating region 203b. By connecting an external power source to the cathode electrode 213 and the anode electrode 214, current can be injected into the refractive-index control layer 209. The cathode electrode 213 is an ohmic electrode composed of, for example, AuGe. The cathode electrode 213 and the anode electrode 214 each have a thickness of, for example, 0.5 µm.

On the insulating film 215, a resin layer 216 is provided along one side surface of the stripe-shaped mesa structure. An electrode pad is formed on the resin layer 216 and is electrically connected to the anode electrode 214 via an electrically connecting pattern. The resin layer 216 is composed of, for example, BCB resin and has a thickness of, for example, 1 µm to 2 µm.

The semi-insulating regions 203a and 203b, the second semi-insulating layer 207, the first-conductivity-type semiconductor layer 208, the refractive-index control layer 209, the cladding layer 211, the insulating film 215, and the resin layer 216 may respectively be integrated with the semi-insulating regions 103a and 103b, the first semi-insulating layer 107, the first-conductivity-type semiconductor layer 108, the refractive-index control layer 109, the cladding layer 111, the insulating film 115, and the resin layer 116 in the gain region 10.

Figure 5:
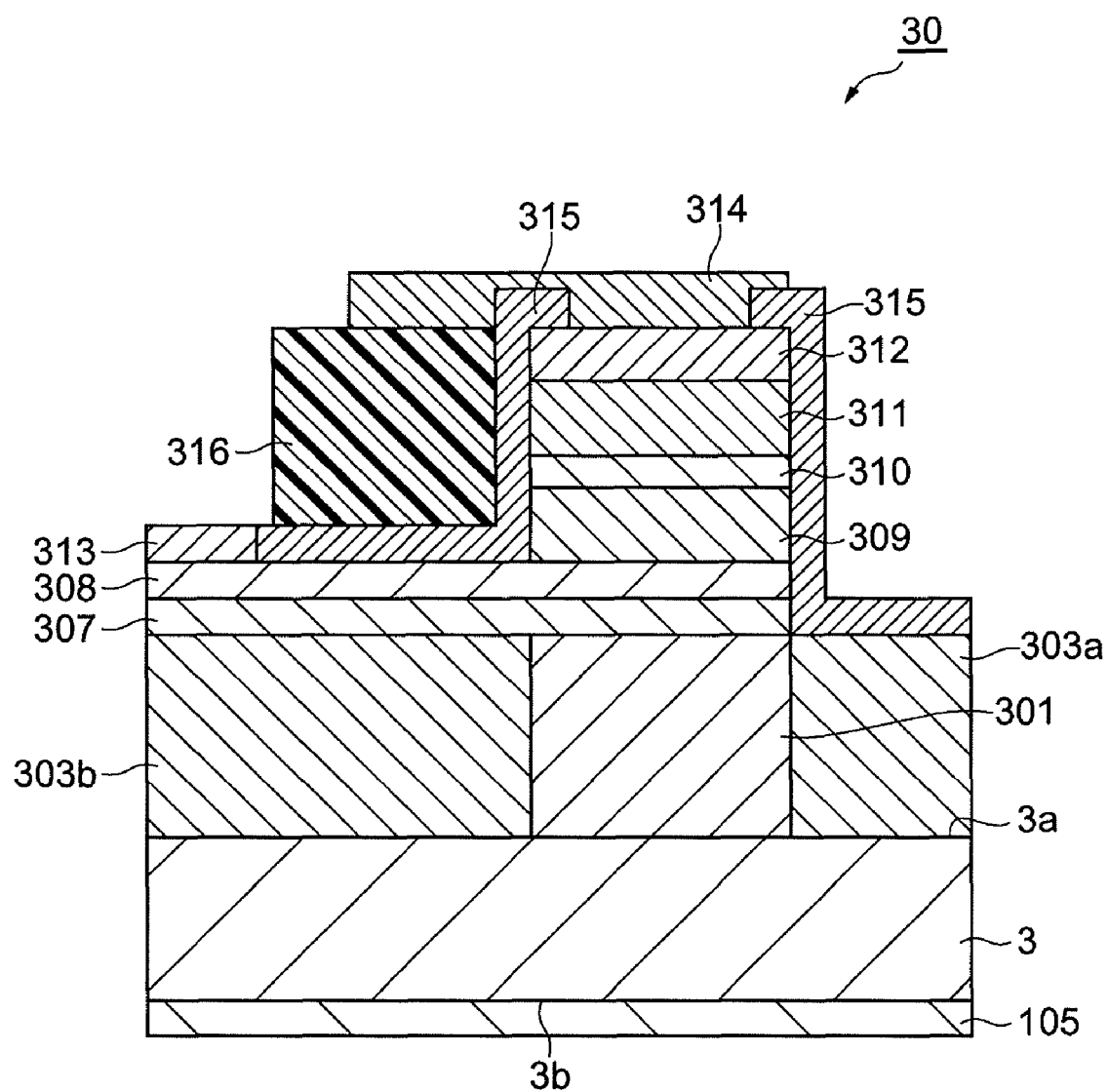
FIG. 5 is a sectional view of the semiconductor laser taken along line V-V in FIG. 1.

Next, the configuration of the phase adjusting region 30 will be described with reference to FIGS. 1, 2, and 5. The phase adjusting region 30 is provided between the gain region 10 and the reflective region 20. As shown in FIGS. 2 and 5, the phase adjusting region 30 includes an optical waveguide layer 301 and third semi-insulating regions 303a and 303b. The phase adjusting region 30 also includes a third semi-insulating layer 307, a first-conductivity-type semiconductor layer 308, refractive-index control layers 309 and 310, a cladding layer 311, a contact layer 312, a cathode electrode 313, and an anode electrode 314.

The optical waveguide layer 301 in the phase adjusting region 30 is an optical waveguide for adjusting an optical path length or phase of light propagating in the laser cavity. One end of the optical waveguide layer 301 is optically coupled to the active layer 101 and the SCH layer 102 of the gain region 10, and another end thereof is optically coupled to the optical waveguide layer 201 of the reflective region 20. The optical waveguide layer 301 in this embodiment is provided on the principal surface 3a of the semiconductor substrate 3 and is composed of, for example, undoped InGaAsP. The bandgap wavelength of the optical waveguide layer 301 is shorter than the bandgap wavelength of the active layer 101 in the gain region 10 and is, for example, 1.3 μm or smaller. The optical waveguide layer 301 has a thickness of, for example, 250 nm. The optical waveguide layer 301 forms a stripe-shaped mesa structure extending in the predetermined light propagation direction. The width of the optical waveguide layer 301 in the direction orthogonal to the light propagation direction is, for example, 1.8 μm.

The third semi-insulating regions 303a and 303b are composed of a semi-insulating semiconductor, such as Fe-doped InP. The third semi-insulating regions 303a and 303b respectively cover opposite side surfaces of the stripe-shaped mesa structure including the optical waveguide layer 301.

The third semi-insulating layer 307 is composed of a semi-insulating semiconductor, such as Fe-doped InP. The third semi-insulating layer 307 is provided on the optical waveguide layer 301 and the third semi-insulating region 303b. The third semi-insulating layer 307 electrically separates the first-conductivity-type semiconductor layer 308 from the optical waveguide layer 301. The third semi-insulating layer 307 has a thickness of, for example, 50 nm.

The first-conductivity-type semiconductor layer 308 is composed of, for example, n-type InP and is provided on the third semi-insulating layer 307. The first-conductivity-type semiconductor layer 308 has a thickness of, for example, 50 nm.

The refractive-index control layers 309 and 310 is used for controlling their refractive indices which are changed by injecting current into these layers through the cathode electrode 313 and the anode electrode 314. These refractive-index control layers 309 and 310 are stacked between a part of the first-conductivity-type semiconductor layer 308 that is located above the optical waveguide layer 301 and the cladding layer 311. The optical path length in the phase adjusting region 30 is changed by controlling the refractive indices of the refractive-index control layers 309 and 310. This change of the optical path length effects a change in the cavity length of the semiconductor laser 1A. On the other hand, the longitudinal mode of the semiconductor laser 1A is related to its cavity length. Therefore, by adjusting the amount of current injected into the refractive-index control layers 309 and 310, the longitudinal mode of the semiconductor laser 1A can be adjusted.

The refractive-index control layer 309 is composed of, for example, undoped InGaAsP and preferably has a bandgap wavelength that is smaller than, for example, 1.3 μM and shorter than the bandgap wavelength of the optical waveguide layer 301. On the other hand, the refractive-index control layer 310 is composed of, for example, p-type InGaAsP and has a bandgap wavelength that is shorter than the bandgap wavelength of the refractive-index control layer 309 and that is, for example, 1.2 μm or smaller. The refractive-index control layers 309 and 310 have thicknesses of, for example, 250 nm and 50 nm, respectively. For another the configuration of the refractive-index control layers 309 and 310, these refractive-index control layers 309 and 310 may be formed of the same semiconductor layer. For example, the refractive-index control layers 309 and 310 may be composed of undoped or p-type InGaAsP and preferably has a bandgap wavelength that is smaller than 1.3 μm and shorter than the bandgap wavelength of the optical waveguide layer 301.

The cladding layer 311 is composed of a second-conductivity-type semiconductor, such as p-type InP, and is provided on the refractive-index control layer 310. The cladding layer 311 has a bandgap wavelength that is shorter than the bandgap wavelength of the refractive-index control layers 309 and 310, and has a thickness of, for example, 1 μm.

The contact layer 312 is provided on the cladding layer 311. The contact layer 312 is composed of a second-conductivity-type semiconductor, such as p-type InGaAs, and has a thickness of, for example, 0.2 μm.

Similar to the refractive-index control layer 109, the diffraction grating layer 110, the cladding layer 111, and the contact layer 112 in the gain region 10, the refractive-index control layers 309 and 310, the cladding layer 311, and the contact layer 312 constitute a stripe-shaped mesa structure extending in the predetermined light propagation direction. An insulating film 315 composed of, for example, SiO$_2$ is provided on the upper surface and both side surfaces of the stripe-shaped mesa structure. The insulating film 315 has a thickness of, for example, 0.3 μm.

A part of the insulating film 315 that is provided on the first-conductivity-type semiconductor layer 308 is provided with an opening for the cathode electrode 313, and a part of the insulating film 315 that is provided on the contact layer 312 is provided with an opening for the anode electrode 314. The anode electrode 314 is provided on the contact layer 312 and is an ohmic electrode composed of, for example, AuZn. By connecting an external power source to the cathode electrode 313 and the anode electrode 314, current can be injected into the refractive-index control layers 309 and 310. The cathode electrode 313 is an ohmic electrode composed of, for example, AuGe. The cathode electrode 313 and the anode electrode 314 each have a thickness of, for example, 0.5 μm.

On the insulating film 315, a resin layer 316 is provided along one side surface of the stripe-shaped mesa structure. The anode electrode 314 extends to the top of the resin layer 316 so as to form a single electrode pad. The resin layer 316 is composed of, for example, BCB resin and has a thickness of, for example, 1 μm to 2 μm.

The third semi-insulating regions 303a and 303b, the third semi-insulating layer 307, the first-conductivity-type semiconductor layer 308, the refractive-index control layer 309, the cladding layer 311, the insulating film 315, and the resin layer 316 may respectively be integrated with the semi-insulating regions 103a and 103b, the first semi-insulating layer 107, the first-conductivity-type semiconductor layer 108, the refractive-index control layer 109, the cladding layer 111, the insulating film 115, and the resin layer 116 in the gain region 10.

The operation and the advantages of the semiconductor laser 1A having the above-described configuration will be described below.

First, in the gain region 10, current can be injected into the active layer 101 through the cathode electrode 105 and the anode electrode 106, and current can also be injected into the refractive-index control layer 109 through the cathode electrode 113 and the anode electrodes 114. The anode electrode 106 and the anode electrodes 114 respectively correspond to first and second electrodes in this embodiment.

Figure 6:
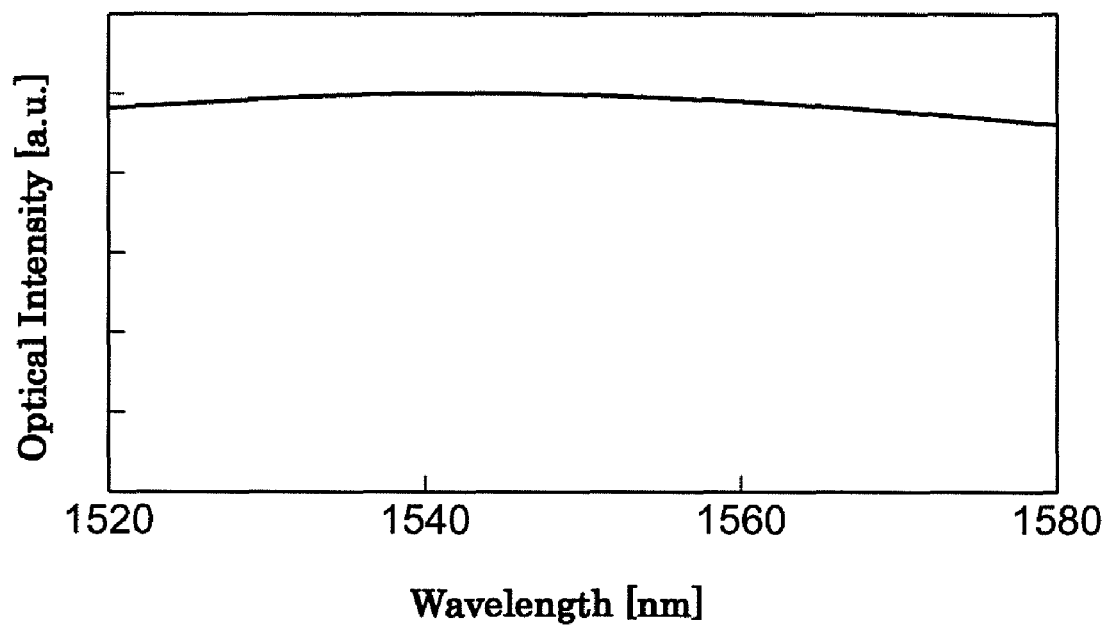
FIG. 6 is a graph showing an example of an emission spectrum of an active layer formed in a gain region.

When current (carrier) is injected into the active layer 101 through the cathode electrode 105 and the anode electrode 106, light is generated in the active layer 101 in accordance with the bandgap wavelength thereof. For example, when a current of 40 to 200 mA is injected into the active layer 101, light having a wavelength band of about 50 nm with a central wavelength of 1550 nm is generated in the active layer 101. FIG. 6 is a graph showing an example of a spectrum of light generated in the active layer 101, in which the ordinate axis indicates the light intensity and the abscissa axis indicates the wavelength.

On the other hand, the diffraction grating 110a of the diffraction grating layer 110 can reflect light in a wavelength range of, for example, 20 nm to 40 nm. When current is not injected into the refractive-index control layer 109 (that is, when the refractive index of the refractive-index control layer 109 is in an initial state), the reflectivity thereof is between 2% and 10%, as mentioned above, and is preferably substantially uniform over the aforementioned wavelength range.

Figure 7:
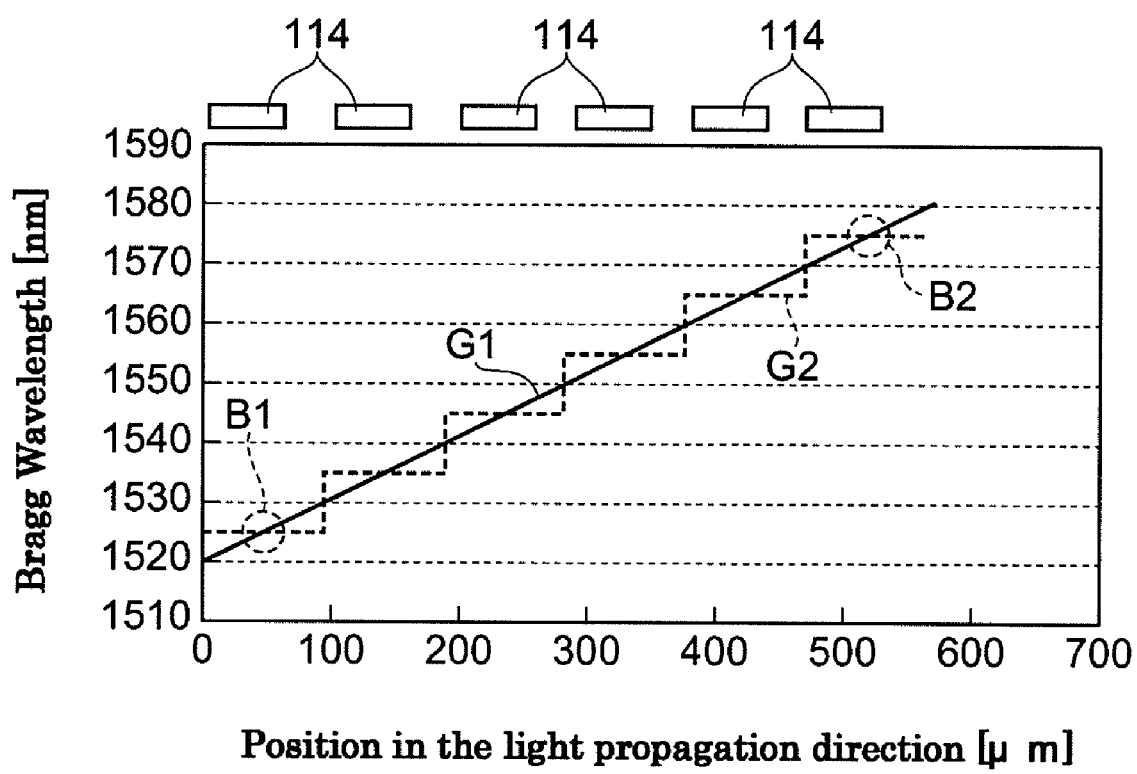
FIG. 7 is a graph showing reflection characteristics of a diffraction grating included in a diffraction grating layer in the gain region, in which a curve G1 denoted by a solid line indicates reflection characteristics of a chirped diffraction grating and a curve G2 denoted by a dashed line indicates reflection characteristics of a stepped diffraction grating.

As mentioned above, the diffraction grating 110a has a grating pitch that varies in the light propagation direction, and reflects light with a wavelength that varies depending on the position in the light propagation direction. The diffraction grating 110a is formed of a chirped diffraction grating whose grating pitch varies continuously in the light propagation direction or a stepped diffraction grating whose grating pitch varies intermittently in the light propagation direction. FIG. 7 is a graph showing reflection characteristics of the diffraction grating 110a. A graph G1 denoted by a solid line indicates reflection characteristics in the case of a chirped diffraction grating, whereas a graph G2 denoted by a dashed line indicates reflection characteristics in the case of a stepped diffraction grating.

The ordinate axis in FIG. 7 indicates a Bragg wavelength calculated from a grating pitch (λ) of the diffraction grating on the basis of the following equation (1):

$$\lambda = 2n_e \Lambda \quad (1)$$

where $\Lambda$ denotes the pitch of the diffraction grating and $n_e$ denotes an effective refractive index. The abscissa axis in FIG. 7 indicates the position in the light propagation direction and has the position of a light-reflecting facet (facet 10a) of the gain region 10 set as "0". In FIG. 7, the positions of the plurality of anode electrodes 114 arranged in the light propagation direction are also shown. In this example, the length of each anode electrode 114 in the light propagation direction is 80 μm, and the distance between neighboring anode electrodes 114 is 10 μm. The distance between the anode electrode 114 located adjacent to the light-reflecting facet and the light-reflecting facet is 5 μm. Furthermore, in FIG. 7, the grating pitch of the diffraction grating 110a directly below the anode electrode 114 closest to the light-reflecting facet is 213.6 nm (B1 section in the drawing), whereas the grating pitch of the diffraction grating 110a directly below the anode electrode 114 farthest from the light-reflecting facet is 220.6 nm (B2 section in the drawing).

Figure 8:
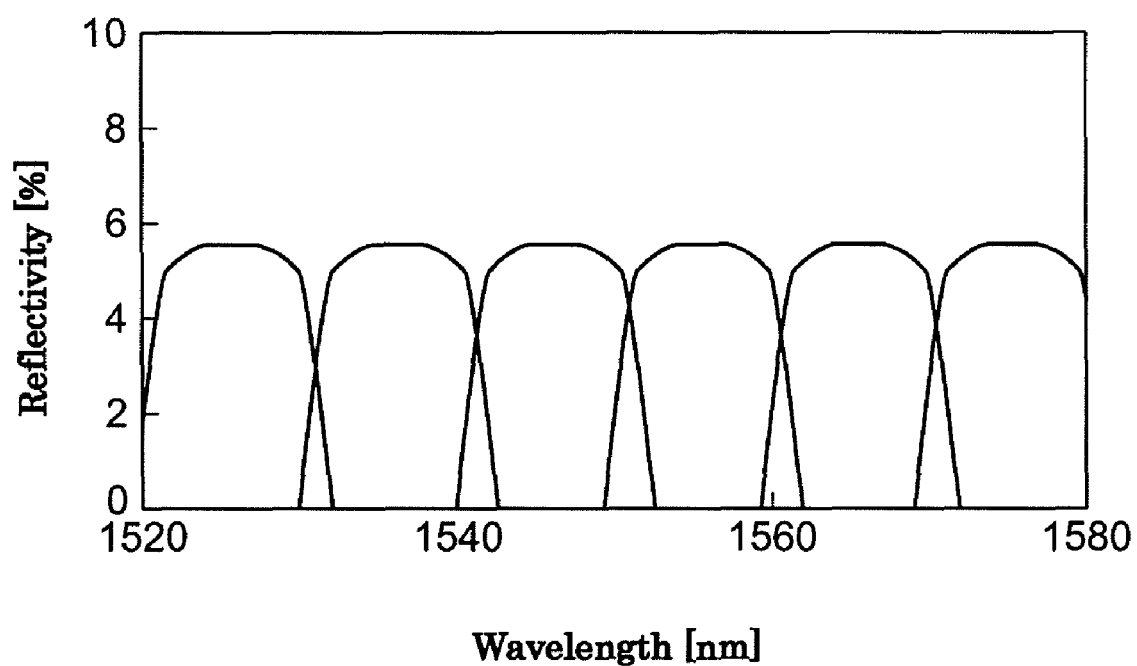
FIG. 8 is a graph showing an example of a reflection spectrum of each area in the diffraction grating layer that corresponds to each of anode electrodes formed in the gain region.

FIG. 8 is a graph showing an example of a reflection spectrum of each area in the diffraction grating layer 110 that corresponds to each of the anode electrodes 114. The ordinate axis in FIG. 8 indicates the reflectivity and the abscissa axis indicates the wavelength. In the example shown in FIG. 8, a wavelength band of C-band (1530 nm to 1570 nm) used in fiber optical communication systems is divided into six segments. The reflectivity on the ordinate axis shown in FIG. 8 corresponds to optical loss (internal loss) in this embodiment. Optical loss (internal loss) in the laser cavity increases with increasing reflectivity.

When the refractive index of the refractive-index control layer 109 changes in response to current injected into the refractive-index control layer 109, the reflectivity of the diffraction grating 110a decreases. In this embodiment, current can be injected individually into the anode electrodes 114; therefore, by applying current to an arbitrary one of the anode electrodes 114, the refractive index of an area in the refractive-index control layer 109 that is located directly below that anode electrode 114 can be selectively set closer to that of the diffraction grating layer 110.

Figure 9:
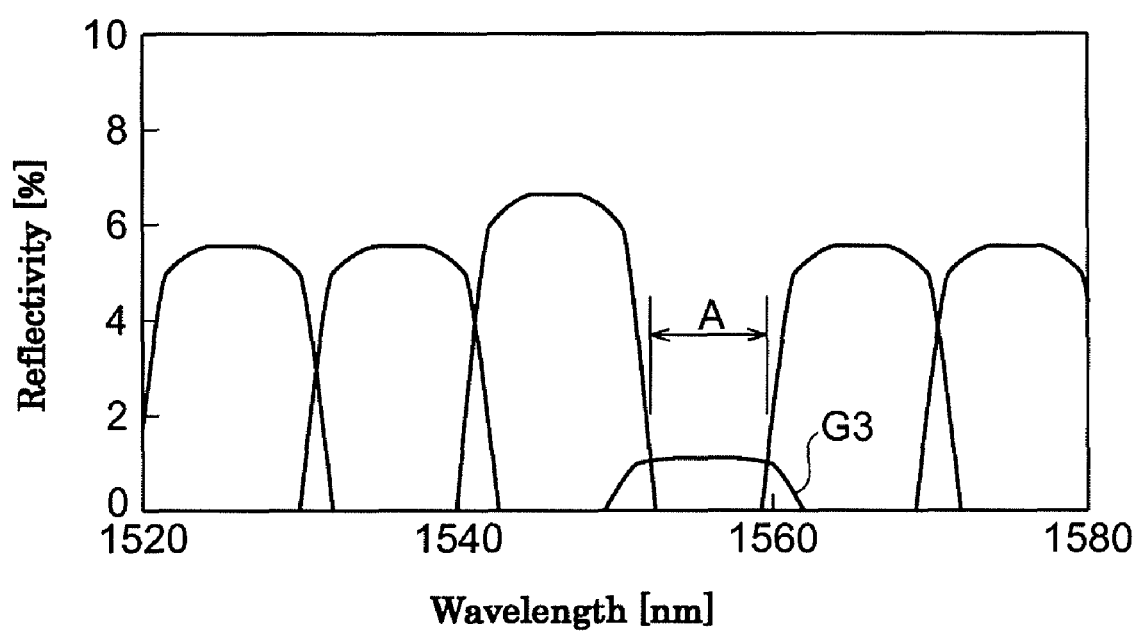
FIG. 9 illustrates a state where the reflectivity of a part of the diffraction grating included in the diffraction grating layer is reduced by applying current to an arbitrary one of the anode electrodes formed in the gain region.

FIG. 9 illustrates a state where the reflectivity of a part of the diffraction grating 110a is reduced by applying current to an arbitrary one of the anode electrodes 114. In detail, of the plurality of anode electrodes 114, current is applied to the third anode electrode 114 counted from the far side of the light-reflecting facet. The reflectivity is reduced in a wavelength range A of about 2 nm to 10 nm corresponding to a reflection spectrum (graph G3 in the drawing) of the part of the diffraction grating 110a that is located directly below the aforementioned anode electrode 114. The amount of current applied to the aforementioned anode electrode 114 is, for example, 0.5 mA to 10 mA.

A phenomenon in which the reflectivity of the aforementioned part of the diffraction grating 110a is reduced by injecting current into a part of the refractive-index control layer 109 will be described in further detail. When current is injected into a part of the refractive-index control layer 109, the reflectivity of the aforementioned part of the refractive-index control layer 109 is reduced due to a carrier plasma effect, causing the effective refractive index $n_e$ in a waveguide mode to change. The Bragg wavelength λ of the aforementioned part where the effective refractive index $n_e$ has changed is shifted towards the shorter wavelength side in accordance with the above equation (1). This causes a reduction in the reflectivity in the wavelength range reflected by the aforementioned part prior to the current injection. On the other hand, at the short wavelength side of this wavelength range with the reduced reflectivity, the reflectivity slightly increases.

The reflection light by the diffraction grating 110a within the optical waveguide in the gain region 10 does not contribute to the stimulated emission for laser oscillation. The diffraction grating 110a causes an optical loss (internal loss) α in the laser cavity. When current is injected into the part of the refractive-index control layer 109, reflectivity of the aforementioned part of the refractive-index control layer 109 is reduced. Then, the optical loss α is reduced in the wavelength range where the reflectivity is reduced. Therefore, a modal gain (ΓG-α) for laser oscillation increases in the wavelength range where the optical loss a is reduced (where Γ denotes a light confinement coefficient and G denotes a gain coefficient). Laser oscillation occurs at this specific wavelength range.

Figure 10:
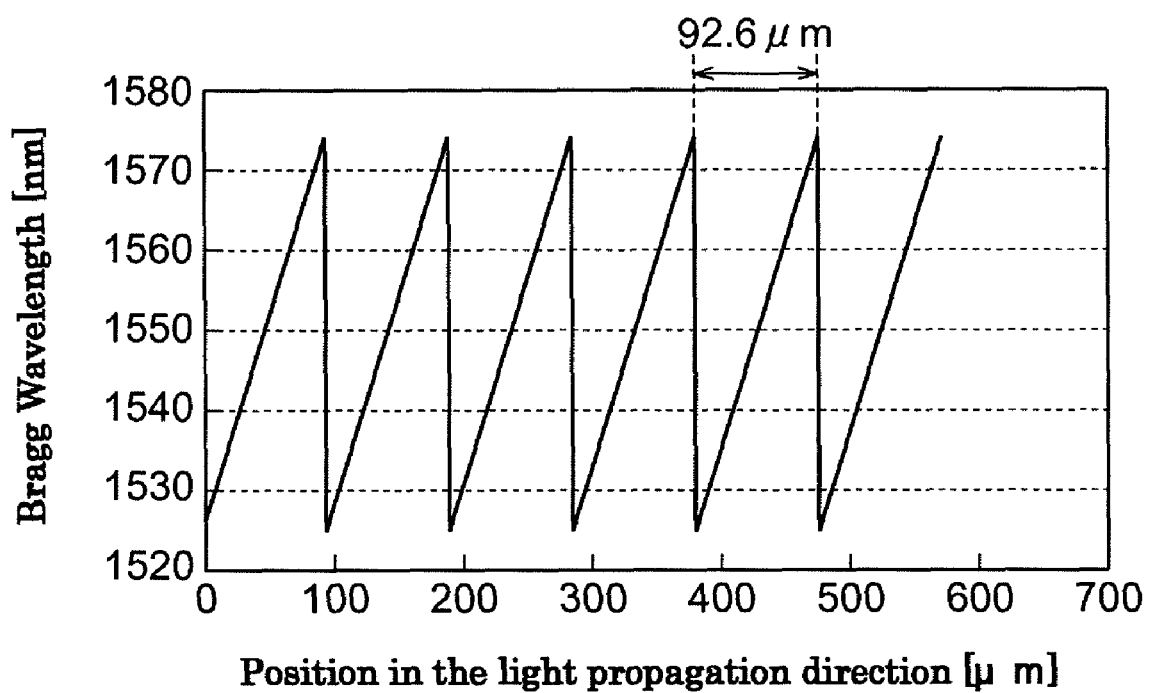
FIG. 10 is a graph showing a design example of a super-structure grating.
Figure 11:
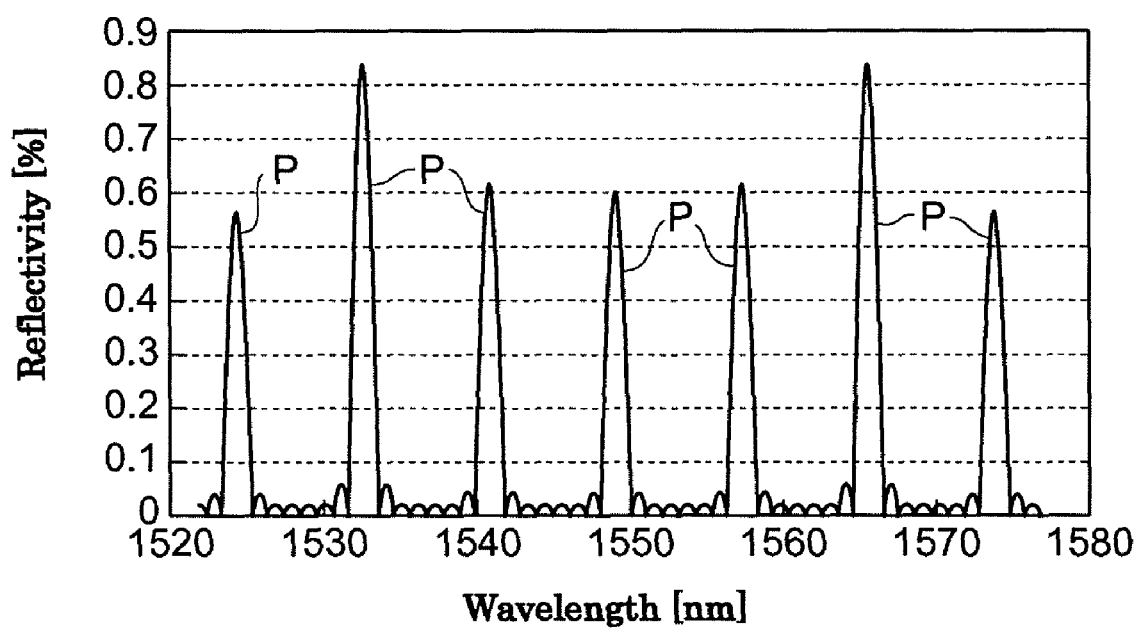
FIG. 11 is a graph showing an example of a reflection spectrum of a reflective region equipped with the super-structure grating.

In the reflective region 20, the diffraction grating layer 210 has the SSG structure 210a, as mentioned above. Therefore, the reflection spectrum of the reflective region 20 has a plurality of reflection peak wavelengths that periodically vary at a predetermined wavelength interval. FIG. 10 is a graph showing a design example of the SSG structure 210a. In FIG. 10, the ordinate axis indicates the Bragg wavelength λ, calculated from the grating pitch (Λ) of the diffraction grating on the basis of the equation (1). The abscissa axis indicates the position in the light propagation direction. In the SSG structure 210a, a plurality of areas are arranged at a fixed interval. In the areas, the reflection wavelength, that is, the pitch of the diffraction grating, varies continuously in the light propagation direction. The interval at which these areas are arranged is equal to, for example, 92.6 μm. In each interval, a section with the shortest reflection wavelength and a section with the longest reflection wavelength have grating pitches of, for example, 213.6 nm and 220.5 nm, respectively. FIG. 11 is a graph showing an example of a reflection spectrum of the reflective region 20 having such an SSG structure 210a. In FIG. 11, the ordinate axis indicates the reflectivity, whereas the abscissa axis indicates the wavelength. As shown in FIG. 11, the reflective region 20 has a plurality of reflection peaks P with, for example, a wavelength width of 1 to 3 nm, and the distance between the reflection peaks P is, for example, 8 nm. A peak reflectivity of each reflection peak P ranges between, for example, 50% and 90%.

Figure 12:
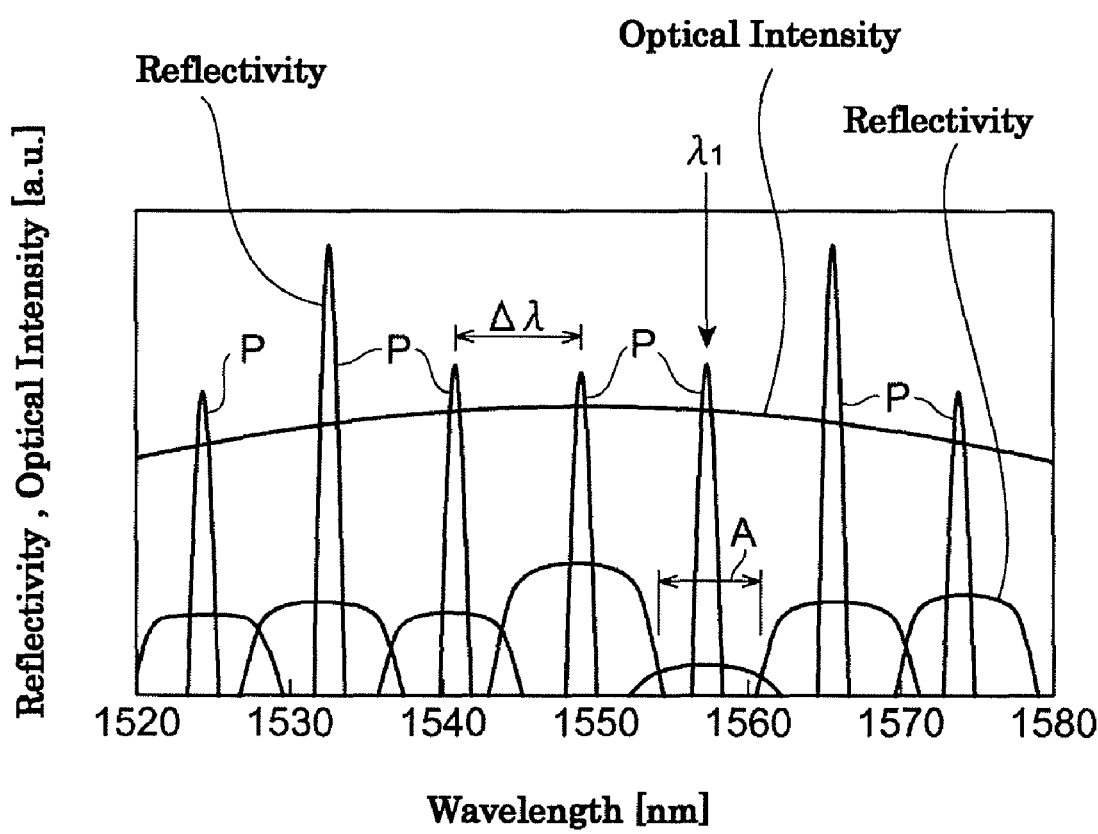
FIG. 12 is a graph showing a combination of an emission spectrum of the active layer formed in the gain region, a reflection spectrum of each area in the diffraction grating layer that corresponds to each of the anode electrodes, and a reflection spectrum of the reflective region.

FIG. 12 is a graph showing a combination of a spectrum of light generated in the active layer 101 (see FIG. 6), a reflection spectrum of each area in the diffraction grating layer 110 that corresponds to each of the anode electrodes 114 (see FIG. 9), and a reflection spectrum of the reflective region 20 (see FIG. 11). In FIG. 12, the ordinate axis indicates the reflectivity or the light intensity, whereas the abscissa axis indicates the wavelength. In a wavelength range of light generated in the active layer 101, the semiconductor laser 1A oscillates at a wavelength $\lambda_1$ in the drawing. The wavelength $\lambda_1$ in this embodiment is a wavelength where a wavelength range A in the drawing overlaps a wavelength range of any one of the reflection peaks P in the reflective region 20. The wavelength range A is a wavelength range where the optical loss (internal loss) is reduced by applying current to an arbitrary one of the anode electrodes 114 in the gain region 10.

The width of the aforementioned wavelength range A and the wavelength interval (Δλ in the drawing) between the reflection peaks P are preferably equal to each other. In consequence, the wavelength ranges where the optical loss is reduced in correspondence to the respective anode electrodes 114 and the reflection peaks P have a one-to-one relationship. Therefore, the wavelength ranges and the reflection peaks P can favorably be made to overlap each other.

A central wavelength of each reflection peak P can be shifted by changing the refractive index of the refractive-index control layer 209 in accordance with the magnitude of current injecting into the refractive-index control layer 209 through the cathode electrode 213 and the anode electrode 214. Therefore, the central wavelength of a reflection peak P can be continuously shifted by injecting current into the refractive-index control layer 209. This allows the continuous wavelength tuning in the aforementioned wavelength range A. The amount of current injected into the refractive-index control layer 209 is, for example, 0 mA to 50 mA.

As mentioned above, in the phase adjusting region 30, the refractive indices of the refractive-index control layers 309 and 310 change in accordance with the magnitude of current injected into these layers through the cathode electrode 313 and the anode electrode 314. In consequence, the optical path length in the phase adjusting region 30 changes in accordance with change of the refractive indices of the refractive-index control layers 309 and 310. Furthermore, the cavity length of the semiconductor laser 1A changes in accordance with these changes of the optical path length and the refractive indices. Specifically, by adjusting the amount of current injected into the refractive-index control layers 309 and 310, the cavity length of the semiconductor laser 1A can be controlled. Since the longitude mode of the semiconductor laser 1A is determined on the basis of the cavity length, this longitudinal mode can be adjusted by adjusting the amount of current injected into the refractive-index control layers 309 and 310. Therefore, within a wavelength range A (see FIG. 12), a laser oscillation wavelength can be continuously selected by adjusting the amount of current injected into the refractive-index control layers 309 and 310.

Second Embodiment

Figure 13:
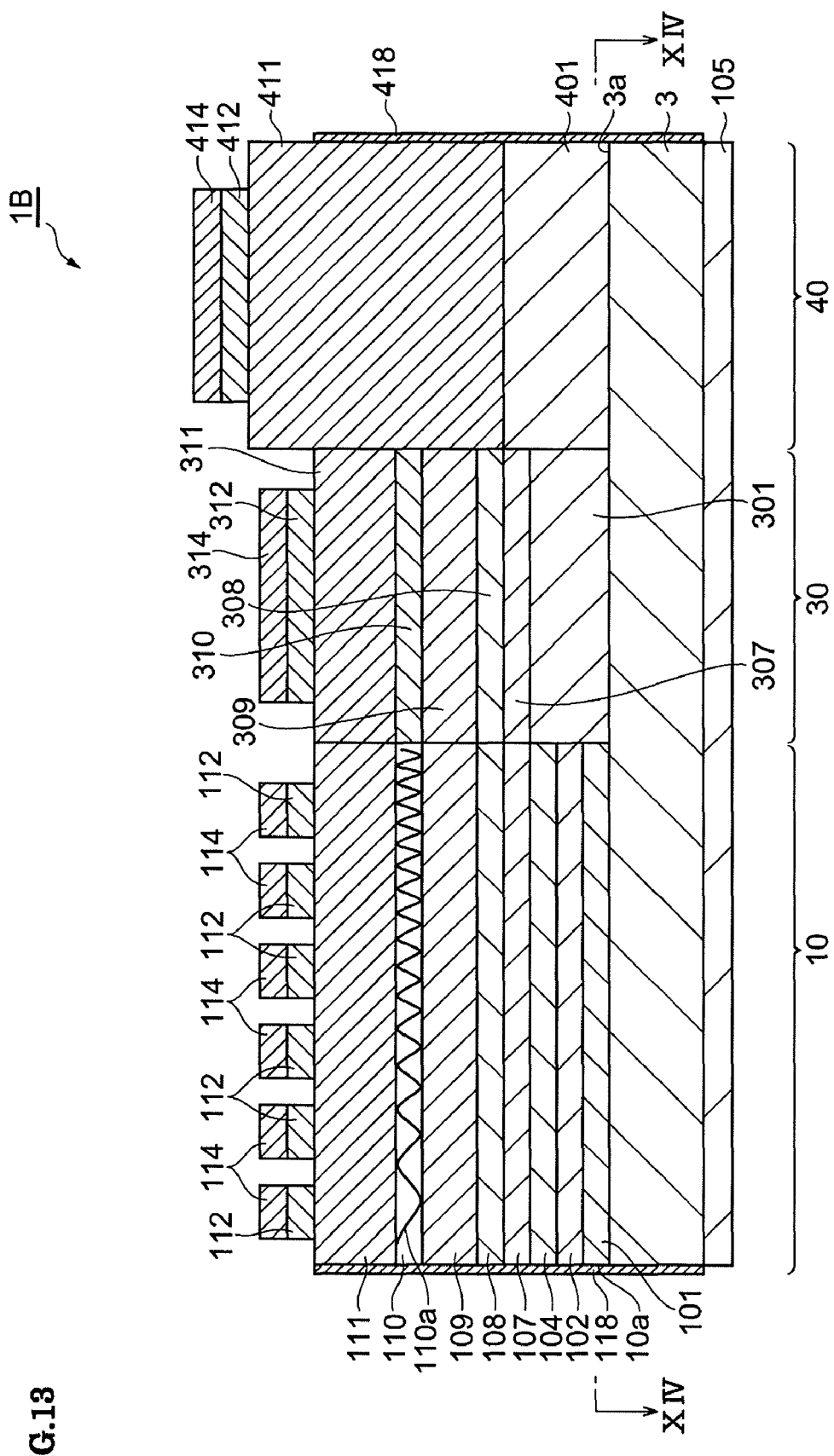
FIG. 13 is a sectional view of a semiconductor laser according to a second embodiment of the present invention taken in a light propagation direction.
Figure 14:
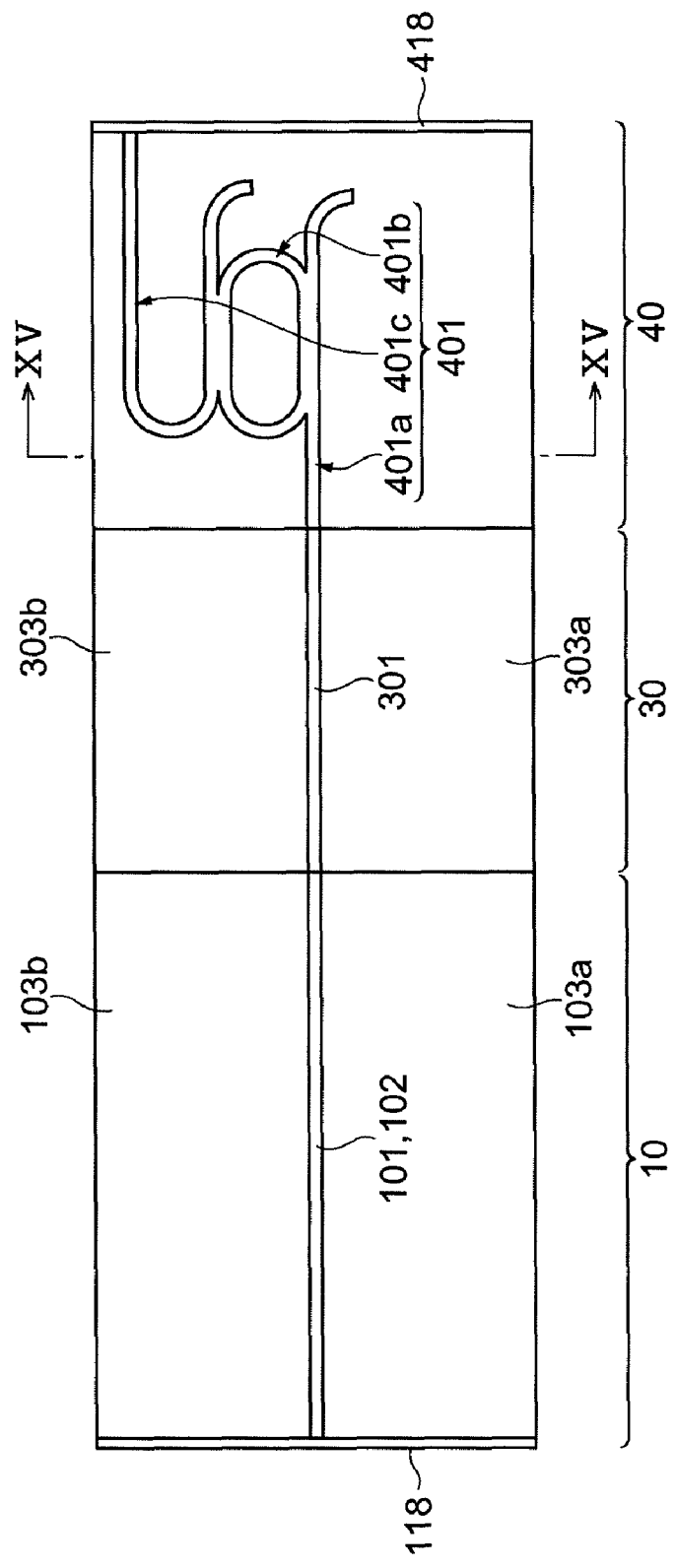
FIG. 14 is a sectional view of the semiconductor laser taken along line XIV-XIV in FIG. 13.

A semiconductor laser 1B according to a second embodiment is also a wavelength tunable semiconductor laser. Referring to FIGS. 13 and 14, the semiconductor laser 1B according to this embodiment includes the gain region 10, the phase adjusting region 30, and a reflective region 40. The gain region 10 is a region where light is generated. The reflective region 40 is a region that reflects light propagating from the gain region 10. The phase adjusting region 30 is a region for controlling the optical path length of the waveguide between the gain region 10 and the reflective region 40. As shown in FIG. 13, the gain region 10, the phase adjusting region 30, and the reflective region 40 are formed on the common semiconductor substrate 3 shared by the three regions, and the gain region 10, the phase adjusting region 30, and the reflective region 40 are arranged in that order in the light propagation direction. The reflective region 40 and the facet 10a of the gain region 10 constitute a laser cavity. Since the configuration and the operation of the gain region 10, the phase adjusting region 30, and the semiconductor substrate 3 are the same as those in the first embodiment already described above, detailed descriptions thereof will not be repeated.

Figure 15:
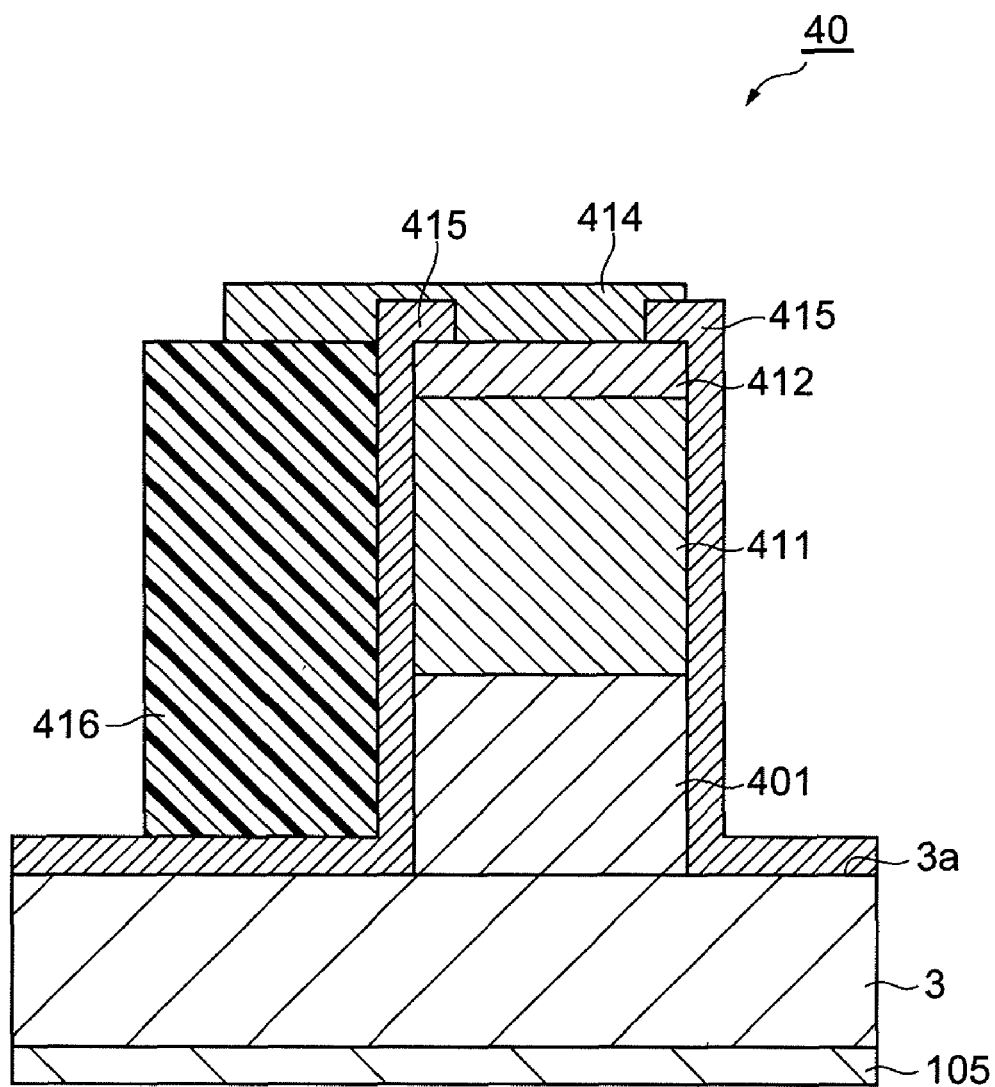
FIG. 15 is a sectional view of the semiconductor laser taken along line XV-XV in FIG. 14.

The configuration of the reflective region 40 will be described with reference to FIGS. 13, 14, and 15. The reflective region 40 is equipped with a ring resonator that includes a ring-shaped portion 401b. The reflective region 40 includes a light modulating layer 401, a cladding layer 411, a contact layer 412, an anode electrode 414, and a dielectric multilayer 418. The back surface of the semiconductor substrate 3 is provided with a common cathode electrode 105.

The light modulating layer 401 constitutes a core portion of an optical waveguide in the reflective region 40. The light modulating layer 401 is optically coupled to the active layer 101 and the SCH layer 102 in the gain region 10 via the phase adjusting region 30. The refractive index of the light modulating layer 401 changes in response to current injected into this light modulating layer 401 through the cathode electrode 105 and the anode electrode 414. The light modulating layer 401 in this embodiment is provided on the principal surface 3a of the semiconductor substrate 3 and is composed of, for example, undoped InGaAsP. The bandgap wavelength of the light modulating layer 401 is shorter than the bandgap wavelength of the active layer 101 in the gain region 10 and is, for example, 1.3 μm or smaller. The light modulating layer 401 has a thickness of, for example, 300 nm and a width of, for example, 1.2 μm in the direction orthogonal to the light propagation direction.

The light modulating layer 401 forms a stripe-shaped mesa structure on the principal surface 3a of the semiconductor substrate 3. As shown in FIG. 14, the light modulating layer 401 has a ring resonator structure that includes a waveguide portion 401a extending in the predetermined light propagation direction, the ring-shaped portion 401b coupled to the waveguide portion 401a via a multimode interference (MMI) coupler, and a waveguide portion 401c coupled to the ring-shaped portion 401b via the MMI coupler. The ring-shaped portion 401b has a diameter of, for example, 10 μm, and the MMI coupler that couples the ring-shaped portion 401b to the waveguide portions 401a and 401c has a length of, for example, 45 μm. One end of the waveguide portion 401c (i.e., another end of the ring resonator) is optically coupled to the dielectric multilayer 418 provided at a facet of the reflective region 40.

The waveguide portion 401a has a configuration for mode conversion. Specifically, the width (waveguide width) of the waveguide portion 401a in the direction orthogonal to the light propagation direction varies in the light propagation direction such that the waveguide width of the waveguide portion 401a at the phase adjusting region 30 side is, for example, 2.4 μm, whereas the waveguide width of the waveguide portion 401a at the ring-shaped portion 401b side is, for example, 1.2 μm. A border area between these two sides is a tapered waveguide whose waveguide width varies linearly, and this tapered waveguide has a length of, for example, 70 μm.

Accordingly, the reflective region 40 includes the light modulating layer 401 having the ring resonator structure. The ring resonator structure works as a wavelength filter that only transmits light within specific wavelength bands. Furthermore, the wavelength bands transmitting light vary periodically. The transmitted light is reflected by the dielectric multilayer 418 provided at the facet of the reflective region 40 so as to be returned to the waveguide portion 401a. As a result, the reflection spectrum of the reflective region 40 has a plurality of reflection peak wavelengths that periodically vary at a predetermined wavelength interval. The reflection peak wavelengths can be shifted by injecting current into the light modulating layer 401 through the cathode electrode 105 and the anode electrode 414 and changing the refractive index thereof.

Of the light propagating from the gain region 10, the reflective region 40 reflects only the light having a wavelength component corresponding to a reflection peak wavelength. Specifically, the reflective region 40 works as one of reflective mirrors in the laser cavity. The reflectivity of the reflective region 40 at a reflection peak wavelength preferably ranges between 50% and 90%.

The cladding layer 411 is composed of a second-conductivity-type semiconductor, such as p-type InP, and is provided on the light modulating layer 401. The cladding layer 411 has a bandgap wavelength that is shorter than the bandgap wavelength of the light modulating layer 401, and has a thickness of, for example, 3 μm.

The contact layer 412 is provided on the cladding layer 411. The contact layer 412 is composed of a second-conductivity-type semiconductor, such as p-type InGaAs, and has a thickness of, for example, 0.2 μm.

The light modulating layer 401, the cladding layer 411, and the contact layer 412 described above constitute a stripe-shaped mesa structure extending in the predetermined light propagation direction. An insulating film 415 composed of, for example, $SiO_2$ is formed on the upper surface and both side surfaces of the stripe-shaped mesa structure. The insulating film 415 has a thickness of, for example, 0.3 μM.

A part of the insulating film 415 that is provided on the contact layer 412 is provided with an opening for the anode electrode 414. The anode electrode 414 is provided on the contact layer 412 and is an ohmic electrode composed of, for example, AuZn. By connecting an external power source to the anode electrode 414 and the cathode electrode 105, current can be injected into the light modulating layer 401. The anode electrode 414 has a thickness of, for example, 0.5 μm.

On the insulating film 415, a resin layer 416 is provided along one side surface of the stripe-shaped mesa structure. An electrode pad is formed on the resin layer 416 and is electrically connected to the anode electrode 414 via an electrically connecting pattern. The resin layer 416 is composed of, for example, BCB resin and has a thickness of, for example, 1 μm to 2 μm.

A part of the cladding layer 411, the insulating film 415, and the resin layer 416 described above may respectively be integrated with the cladding layer 111, the insulating film 115, and the resin layer 116 in the gain region 10.

Figure 16:
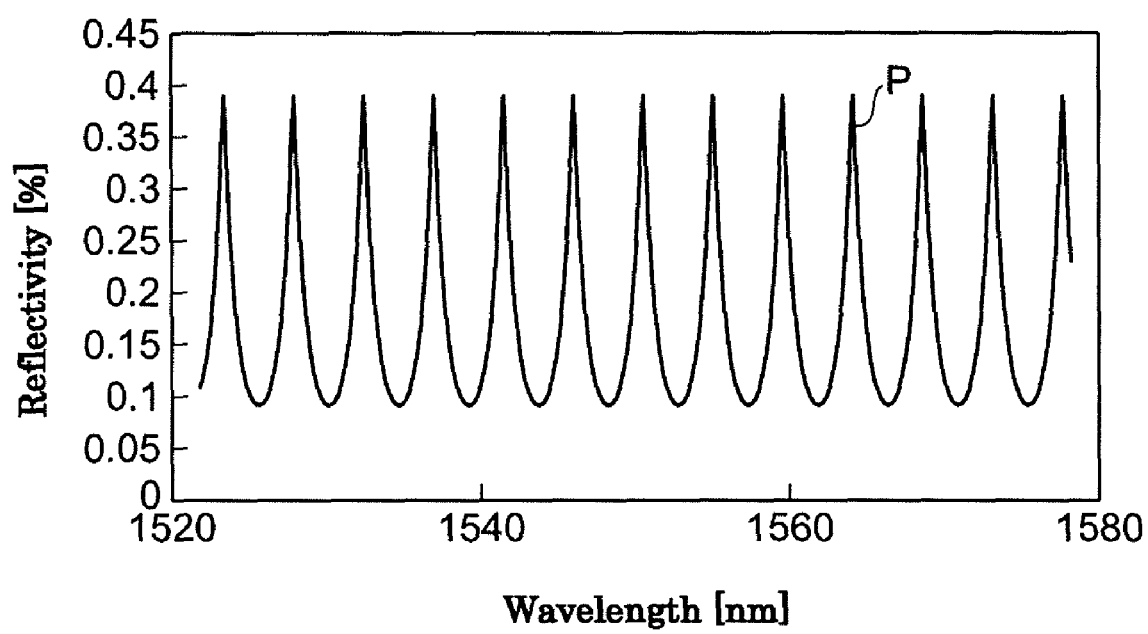
FIG. 16 is a graph showing an example of a reflection spectrum of a reflective region.

In the reflective region 40 described above, the light modulating layer 401 having the aforementioned ring resonator structure and the dielectric multilayer 418 provided at the facet of the reflective region 40 constitute a reflector. As a result, the reflection spectrum of the reflective region 40 has a plurality of reflection peak wavelengths that periodically vary at a predetermined wavelength interval. FIG. 16 is a graph showing an example of a reflection spectrum of the reflective region 40. In FIG. 16, the ordinate axis indicates the reflectivity, whereas the abscissa axis indicates the wavelength. As shown in FIG. 16, the reflection spectrum of the reflective region 40 has a plurality of reflection peaks P at an interval of, for example, 4.4 nm. A peak reflectivity of each reflection peak P ranges between, for example, 50% and 90%.

Figure 17:
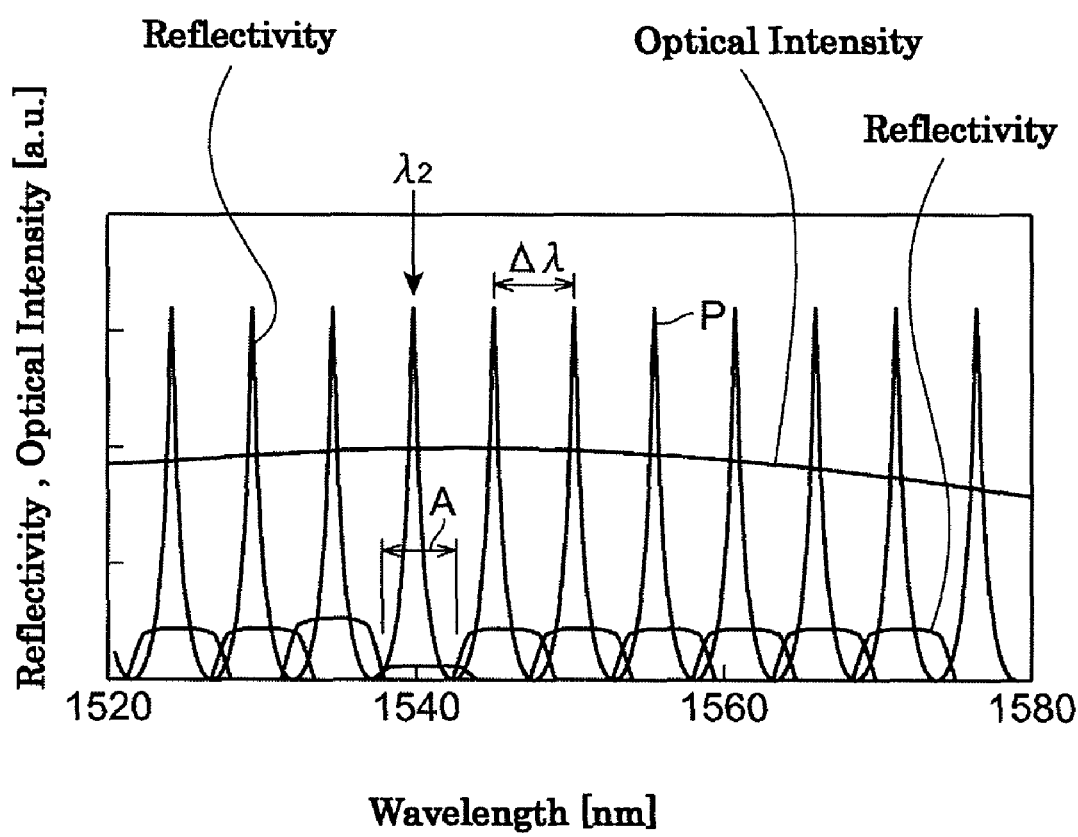
FIG. 17 is a graph showing a combination of an emission spectrum of the active layer formed in the gain region, a reflection spectrum of each area in the diffraction grating layer that corresponds to each of the anode electrodes, and a reflection spectrum of the reflective region.

FIG. 17 is a graph showing a combination of a spectrum of light generated in the active layer 101 (see FIG. 6), a reflection spectrum of each area in the diffraction grating layer 110 that corresponds to each of the anode electrodes 114 (see FIG. 9), and a reflection spectrum of the reflective region 40 (see FIG. 16). In FIG. 17, the ordinate axis indicates the reflectivity or the light intensity, whereas the abscissa axis indicates the wavelength. In a wavelength range of light generated in the active layer 101, the semiconductor laser 1B oscillates at a wavelength $\lambda_2$ in the drawing. The wavelength $\lambda_2$ in this embodiment is a wavelength where a wavelength range A in the drawing overlaps a wavelength range of any one of the reflection peaks P in the reflective region 40. The wavelength range A is a wavelength range where the optical loss (internal loss) is reduced by applying current to an arbitrary one of the anode electrodes 114 in the gain region 10.

In this embodiment, the width of the aforementioned wavelength range A and the wavelength interval ($\Delta\lambda$ in the drawing) between the reflection peaks P are preferably equal to each other. In consequence, the wavelength ranges where the optical loss is reduced in correspondence to the respective anode electrodes 114 and the reflection peaks P have a one-to-one relationship. Therefore, the wavelength ranges and the reflection peaks P can favorably be made to overlap each other.

A central wavelength of each reflection peak P can be shifted by changing the refractive index of the light modulating layer 401 in accordance with the magnitude of current injecting into the light modulating layer 401 through the cathode electrode 105 and the anode electrode 414. Therefore, the central wavelength of a reflection peak P can be continuously shifted by injecting current into the light modulating layer 401. This allows the continuous wavelength tuning in the aforementioned wavelength range A.

The semiconductor laser according to the present invention is not limited to the embodiments described above, and various modifications are permissible. For example, although a super-structure grating (SSG), a sampled grating (SG), and a ring resonator are described as examples of a specific configuration of the reflective region in each of the above embodiments, an alternative structure may be used so long as the structure can achieve wavelength-versus-reflectivity characteristics in which the wavelengths periodically vary at a predetermined wavelength interval.

Furthermore, the semiconductor layer structure and the electrode arrangement in the gain region are not limited to the above embodiments, and an alternative structure may be used so long as the structure allows current to be individually injected into the active layer and the refractive-index control layer.

Although the principle of the present invention has been described in the preferred embodiments with reference to the drawings, it is recognized by a skilled person that the arrangement and details in the present invention are changeable without departing from the principle. The present invention is not to be limited to the specific configurations disclosed in the embodiments. Therefore, all modifications and changes that may occur within the scope of the claims and the spirit thereof are to be included as claimed patent rights.

What is claimed is:

1. A wavelength tunable semiconductor laser comprising:
    a first facet and a second facet opposite the first facet;
    a reflective region provided adjacent to the second facet, the reflective region having a plurality of reflection peak wavelengths that periodically vary at a predetermined wavelength interval; and
    a gain region provided between the first facet and the reflective region,
    wherein the first facet and the reflective region constitute a laser cavity, and
    wherein the gain region includes
    an active layer where light is generated,
    a diffraction grating layer having a diffraction grating whose grating pitch varies in a light propagation direction,
    a refractive-index control layer provided between the active layer and the diffraction grating layer,
    a first electrode for injecting current into the active layer, and
    a plurality of second electrodes arranged in the light propagation direction to inject current into the refractive-index control layer.

2. The semiconductor laser according to claim 1, wherein the diffraction grating included in the diffraction grating layer of the gain region is a chirped diffraction grating whose grating pitch varies continuously.

3. The semiconductor laser according to claim 1, wherein the grating pitch of the diffraction grating included in the diffraction grating layer of the gain region varies intermittently.

4. The semiconductor laser according to claim 1, wherein the diffraction grating included in the diffraction grating layer of the gain region has a reflectivity that is smaller than a reflectivity of the first facet.

5. The semiconductor laser according to claim 1, wherein the diffraction grating included in the diffraction grating layer of the gain region has a reflectivity that ranges between 2% and 10%.

6. The semiconductor laser according to claim 1, wherein the diffraction grating of the diffraction grating layer has a wavelength range in which a reflectivity of the diffraction grating changes by injecting current into one of the plurality of second electrodes, wherein the wavelength range is equal to the predetermined wavelength interval between the reflection peak wavelengths of the reflective region.

7. The semiconductor laser according to claim 1, wherein the gain region further includes
    a stripe-shaped mesa structure including the active layer,
    a first semi-insulating region that covers both side surfaces of the stripe-shaped mesa structure including the active layer, and
    a first semi-insulating layer formed between the active layer and the refractive-index control layer.

8. The semiconductor laser according to claim 1, wherein a reflectivity of the reflective region ranges between 50% and 90%.

9. The semiconductor laser according to claim 1, wherein the refractive-index control layer and the diffraction grating layer each have a bandgap wavelength that is shorter than a bandgap wavelength of the active layer.

10. The semiconductor laser according to claim 1, wherein the reflective region includes
    an optical waveguide optically coupled to the first facet, the optical waveguide including an optical waveguide layer as a core portion thereof, and
    a super-structure grating provided along the optical waveguide.

11. The semiconductor laser according to claim 10, wherein the reflective region further includes
    a stripe-shaped mesa structure including the optical waveguide,
    a second semi-insulating region that covers both side surfaces of the stripe-shaped mesa structure including the optical waveguide,
    a refractive-index control layer of the reflective region formed on the optical waveguide,
    a reflective diffraction grating layer including the super-structure grating and provided on the refractive-index control layer of the reflective region, and
    a second semi-insulating layer formed between the optical waveguide and the refractive-index control layer of the reflective region.

12. The semiconductor laser according to claim 11, wherein the refractive-index control layer of the reflective region and the reflective diffraction grating layer each have a bandgap wavelength that is shorter than a bandgap wavelength of the optical waveguide layer of the reflective region.

13. The semiconductor laser according to claim 1, wherein the reflective region includes
    a ring resonator whose one end is optically connected to the gain region, and
    a dielectric multilayer provided at another end of the ring resonator.

14. The semiconductor laser according to claim 13, wherein the ring resonator includes
    a light modulating layer that constitutes a core portion of an optical waveguide,
    a cladding layer provided on the light modulating layer,
    a contact layer provided on the cladding layer, and
    an electrode provided on the contact layer.

15. The semiconductor laser according to claim 1, further comprising a phase adjusting region provided between the gain region and the reflective region to control an optical path length of a waveguide between the gain region and the reflective region.

16. The semiconductor laser according to claim 15, wherein the phase adjusting region includes
- a phase-adjustment optical waveguide,
- a stripe-shaped mesa structure including the phase-adjustment optical waveguide,
- a third semi-insulating region that covers both side surfaces of the stripe-shaped mesa structure including the phase-adjustment optical waveguide,
- a refractive-index control layer of the phase adjusting region formed on the phase-adjustment optical waveguide, and
- a third semi-insulating layer formed between the phase-adjustment optical waveguide and the refractive-index control layer.

17. The semiconductor laser according to claim 16, wherein the optical path length of the waveguide between the gain region and the reflective region changes by injecting current into the refractive-index control layer of the phase adjusting region.

* * * * *